United States Patent
Dou et al.

(10) Patent No.: US 12,435,100 B2
(45) Date of Patent: Oct. 7, 2025

(54) PEROVSKITE SOLAR CELLS

(71) Applicant: Purdue Research Foundation, West Lafayette, IN (US)

(72) Inventors: Letian Dou, West Lafayette, IN (US); Ke Ma, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 220 days.

(21) Appl. No.: 17/586,869

(22) Filed: Jan. 28, 2022

(65) Prior Publication Data

US 2022/0246865 A1 Aug. 4, 2022

Related U.S. Application Data

(60) Provisional application No. 63/145,668, filed on Feb. 4, 2021.

(51) Int. Cl.

| | |
|---|---|
| C07F 7/24 | (2006.01) |
| C07F 7/22 | (2006.01) |
| H01G 9/00 | (2006.01) |
| H01G 9/20 | (2006.01) |
| H10K 30/40 | (2023.01) |
| H10K 30/50 | (2023.01) |
| H10K 30/81 | (2023.01) |
| H10K 71/12 | (2023.01) |

(Continued)

(52) U.S. Cl.
CPC .............. *C07F 7/24* (2013.01); *C07F 7/2208* (2013.01); *H01G 9/0036* (2013.01); *H01G 9/2009* (2013.01); *H10K 30/81* (2023.02); *H10K 71/12* (2023.02); *H10K 85/30* (2023.02); *H10K 85/50* (2023.02); *H10K 30/40* (2023.02); *H10K 30/50* (2023.02)

(58) Field of Classification Search
CPC ........ H10K 30/40; H10K 30/30; H10K 30/57; H10K 30/81; H10K 85/30; H01G 9/0036; H01G 9/2009
See application file for complete search history.

(56) References Cited

U.S. PATENT DOCUMENTS

2018/0301646 A1* 10/2018 Kanatzidis ............. H10K 30/10
2020/0105481 A1* 4/2020 Bawendi ................ H10K 85/30

(Continued)

OTHER PUBLICATIONS

Yan et al, General Post-annealing Method Enables High-Efficiency Two-Dimensional Perovskite Solar Cells, ACS Appl. Mater. Interfaces 2018, 10, 33187-33197. (Year: 2018).*

(Continued)

*Primary Examiner* — Andrew J Golden
(74) *Attorney, Agent, or Firm* — Purdue Research Foundation

(57) ABSTRACT

The present disclosure relates to novel perovskite solar cells, and the method of making and using the novel perovskite solar cells. More specifically, a triple cation perovskite solar cell device containing a multifunctional capping layer (MCL) of $R^1NH_3^+$ and/or a thin layer of two-dimensional (2D) material of $(R^1NH_3^+)_2(A^+)_{n-1}(M^{2+})_n(X^-)_{3n+1}$ on top of the commonly used ABX3 perovskite, with enhanced power conversion efficiency of 22.06% (from 19.94%) with long-term stability over 1000 hours under continuous illumination has been developed.

19 Claims, 9 Drawing Sheets

(51) Int. Cl.
H10K 85/30 (2023.01)
H10K 85/50 (2023.01)

(56) References Cited

U.S. PATENT DOCUMENTS

2020/0152395 A1* 5/2020 Lutsen .................. H10K 30/30
2020/0381184 A1* 12/2020 Su ......................... H10K 30/40

OTHER PUBLICATIONS

Li et al, The 2D Halide Perovskite Rulebook: How the Spacer Influences Everything from the Structure to Optoelectronic Device Efficiency, Chem. Rev. 2021, 121, 2230-2291. (Year: 2021).*
Shi et al, Two-dimensional halide perovskite lateral epitaxial heterostructures, Nature 580, 614-620 (2020). (Year: 2020).*
Sutanto et al, Dynamical evolution of the 2D/3D interface: a hidden driver behind perovskite solar cell instability, J. Mater. Chem. A, 2020, 8, 2343. (Year: 2019).*
Rong, Y. et al. Challenges for commercializing perovskite solar cells. Science 361, eaat8235 (2018).
Ni, Z. et al. Resolving spatial and energetic distributions of trap states in metal halide perovskite solar cells. Science 367, 1352-1358 (2020).
Cho, A.N. et al. Impact of Interfacial Layers in Perovskite Solar Cells. ChemSusChem 10, 3687-3704 (2017).
Luo, D. et al. Minimizing non-radiative recombination losses in perovskite solar cells. Nat. Rev. Mater. 5, 44-60 (2020).
Liu, Y. et al. Ultrahydrophobic 3D/2D fluoroarene bilayer-based water-resistant perovskite solar cells with efficiencies exceeding 22%. Sci. Adv. 5, eaaw2543 (2019).
Yang, S. et al. Stabilizing halide perovskite surfaces for solar cell operation with wide-bandgap lead oxysalts. Science 365, 473-478 (2019).
Jiang, Q. et al. Surface passivation of perovskite film for efficient solar cells. Nat. Photonics 13, 460-466 (2019).
Wang, R. et al. Constructive molecular configurations for surface-defect passivation of perovskite photovoltaics. Science 366, 1509-1513 (2019).
Zheng, X. et al. Managing grains and interfaces via ligand anchoring enables 22.3%—efficiency inverted perovskite solar cells. Nat. Energy 5, 131-140 (2020).
Jung, E. H. et al. Efficient, stable and scalable perovskite solar cells using poly(3-hexylthiophene). Nature 567, 511-515 (2019).
Wolff, C. M. et al. Perfluorinated Self-Assembled Monolayers Enhance the Stability and Efficiency of Inverted Perovskite Solar Cells. ACS Nano 14, 1445-1456 (2020).
Li, H. et al. Intermolecular π-πConjugation Self-Assembly to Stabilize Surface Passivation of Highly Efficient Perovskite Solar Cells. Adv. Mater. 32, 1907396 (2020).
Zhang, M. et al. Reconfiguration of interfacial energy band structure for high-performance inverted structure perovskite solar cells. Nat. Commun. 10, 4593 (2019).
Duim, H. et al. Mechanism of surface passivation of methylammonium lead tribromide single crystals by benzylamine. Appl. Phys. Rev. 6, 31401 (2019).
Gao, Y. et al. Molecular engineering of organic-inorganic hybrid perovskites quantum wells. Nat. Chem. 11, 1151-1157 (2019).
Dunlap-Shohl, W. A. et al. Tunable internal quantum well alignment in rationally designed oligomer-based perovskite films deposited by resonant infrared matrix-assisted pulsed laser evaporation. Mater. Horizons 6, 1707-1716 (2019).
Meng, L. et al. Tailored Phase Conversion under Conjugated Polymer Enables Thermally Stable Perovskite Solar Cells with Efficiency Exceeding 21%. J. Am. Chem. Soc. 140, 17255-17262 (2018).
Ran, C. et al. Conjugated Organic Cations Enable Efficient Self-Healing FASnI3 Solar Cells. Joule 3, 3072-3087 (2019).
Lin, Y. et al. π-Conjugated Lewis Base: Efficient Trap-Passivation and Charge-Extraction for Hybrid Perovskite Solar Cells. Adv. Mater. 29, 1604545 (2017).
Park, S. M., et al. Surface Ligands for Methylammonium Lead Iodide Films: Surface Coverage, Energetics, and Photovoltaic Performance. ACS Energy Lett. 5, 799-806 (2020).
Jiang, Q. et al. Interfacial Molecular Doping of Metal Halide Perovskites for Highly Efficient Solar Cells. Adv. Mater. 32, 2001581 (2020).
Chen, P. et al. In Situ Growth of 2D Perovskite Capping Layer for Stable and Efficient Perovskite Solar Cells. Adv. Funct. Mater. 28, 1706923 (2018).
Yang, S. et al. Tailoring Passivation Molecular Structures for Extremely Small Open-Circuit Voltage Loss in Perovskite Solar Cells. J. Am. Chem. Soc. 141, 5781-5787 (2019).
Wu, Z. et al. Highly Efficient Perovskite Solar Cells Enabled by Multiple Ligand Passivation. Adv. Energy Mater. 10, 1903696 (2020).
Abdi-Jalebi, M. et al. Charge extraction via graded doping of hole transport layers gives highly luminescent and stable metal halide perovskite devices. Sci. Adv. 5, eaav2012 (2019).
Kirchartz, T., et al. Photoluminescence-Based Characterization of Halide Perovskites for Photovoltaics. Adv. Energy Mater. 10, 1904134 (2020).
Abdi-Jalebi, M. et al. Maximizing and stabilizing luminescence from halide perovskites with potassium passivation. Nature 555, 497-501 (2018).
Agresti, A. et al. Titanium-carbide MXenes for work function and interface engineering in perovskite solar cells. Nat. Mater. 18, 1228-1234 (2019).
Jeong, M. et al. Stable perovskite solar cells with efficiency exceeding 24.8% and 0.3-V voltage loss. Science 369, 1615-1620 (2020).
Stolterfoht, M. et al. The impact of energy alignment and interfacial recombination on the internal and external open-circuit voltage of perovskite solar cells. Energy Environ. Sci. 12, 2778-2788 (2019).
Yoo, S.-M. et al. An Equivalent Circuit for Perovskite Solar Cell Bridging Sensitized to Thin Film Architectures. Joule 3, 2535-2549 (2019).
Wang, H. et al. Ligand-Modulated Excess PbI2 Nanosheets for Highly Efficient and Stable Perovskite Solar Cells. Adv. Mater. 32, 2000865 (2020).
Zheng, D. et al. Simultaneous Bottom-Up Interfacial and Bulk Defect Passivation in Highly Efficient Planar Perovskite Solar Cells using Nonconjugated Small-Molecule Electrolytes. Adv. Mater. 31, 1903239 (2019).
Xu, J. et al. Triple-halide wide-band gap perovskites with suppressed phase segregation for efficient tandems. Science 367, 1097-1104 (2020).
Kim, D. et al. Efficient, stable silicon tandem cells enabled by anion-engineered wide-bandgap perovskites. Science 368, 155-160 (2020).
Gautam, S. K. et al. Reversible Photoinduced Phase Segregation and Origin of Long Carrier Lifetime in Mixed-Halide Perovskite Films. Adv. Funct. Mater. 30, 2002622 (2020).
Lin, Y. et al. Excess charge-carrier induced instability of hybrid perovskites. Nat. Commun. 9, 4981 (2018).
Lin, Y.-H. et al. A piperidinium salt stabilizes efficient metal-halide perovskite solar cells. Science 369, 96-102 (2020).
Liu, Z. et al. A holistic approach to interface stabilization for efficient perovskite solar modules with over 2,000-hour operational stability. Nat. Energy 5, 596-604 (2020).

* cited by examiner a CsFAMA b CsFAMA-MCL c CsFAMA-4Tm-Boc

PEROVSKITE SOLAR CELLS

CROSS REFERENCE TO RELATED APPLICATIONS

This present patent application relates to and claims the priority benefit of U.S. Provisional Application Ser. No. 63/145,668, filed Feb. 4, 2021, the content of which is hereby incorporated herein by reference in its entirety.

GOVERNMENT RIGHTS

This invention was made with government support under N00014-19-1-2296 awarded by the Office of Naval Research. The government has certain rights in the invention.

TECHNICAL FIELD

The present disclosure relates to novel perovskite solar cells, and the method of making and using the novel perovskite solar cells.

BACKGROUND

This section introduces aspects that may help facilitate a better understanding of the disclosure. Accordingly, these statements are to be read in this light and are not to be understood as admissions about what is or is not prior art.

Organic-inorganic halide perovskite solar cells (PSCs) have seen a rapid increase in power conversion efficiency (PCE), reaching a certified value of over 25% for laboratory scale devices. Nevertheless, the long-term stability of the PSCs under operational conditions remains a significant hurdle on the road to commercialization. The best performing PSCs employ electron transporting layers (ETLs) and hole transporting layers (HTLs) for efficient photogenerated charge carrier extraction. However, decomposition of perovskites is usually initialized from the interface between perovskites and the charge transporting layers, owing to the high defect density, interface charge accumulation, and ion migration. These issues not only leave the perovskite vulnerable to degradation, but also are sources of non-radiative recombination losses in the devices. To address these issues, tremendous efforts have been devoted to interface modification in PSCs. Small organic molecules, polymers, inorganic layers, and low-dimensional perovskites have all been applied to the interface to passivate defects, stabilize the surface lattice, tune the surface potential of perovskite, and simultaneously induce physical coverage to enhance stability. However, most of the interface modification methods introduce electrically insulating layers, which brings a trade-off between surface passivation and charge transfer. Therefore, the interface modifications have to be finely controlled to avoid inhibiting charge transfer.

Therefore, perovskite solar cells with finely controlled interface modification to avoid inhibiting charge transfer are still needed.

SUMMARY

The present disclosure relates to novel perovskite solar cells, and the method of making and using the novel perovskite solar cells.

In one embodiment, the present disclosure provides a solar cell comprising, from bottom to top, a support layer; an electron transporting layer; a perovskite layer; a capping layer; a hole transporting layer; and a counter electrode layer, wherein the capping layer comprises an organic-inorganic hybrid perovskite of Formula I:

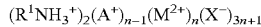

wherein:
($R^1NH_3^+$) represents an asymmetric mono-ammonium cationic moiety:

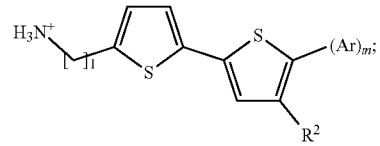

$A^+$ represents a cation $Cs^+$, $Rb^+$, $CH_3NH_3^+$, $CH_3CH_2NH_3^+$, or

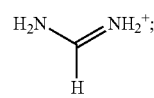

$R^2$ is —H, —F, —Cl, —Br, —I, —Me, —Et, —OMe, —OEt, —SMe, —SEt, —CN, —$NO_2$, —COMe, —CHO, —COOMe, or —NH—COMe;

$(Ar)_m$ represents a conjugated and optionally substituted aryl or hetero aryl system, or a combination thereof, wherein each aryl or hetero aryl ring in the conjugated and optionally substituted aryl or hetero aryl system may be same or different;

$M^{2+}$ represents a divalent metal cation $Pb^{2+}$, $Sn^{2+}$, $Ge^{2+}$, $Cu^{2+}$, $Zn^{2+}$, $Cd^{2+}$, $Hg^{2+}$, $Ni^{2+}$, $Co^{2+}$, $Fe^{2+}$, $Mn^{2+}$, $Cr^{2+}$, $V^{2+}$, $Pd^{2+}$, $Pt^{2+}$, or a combination thereof; or a combination of one monovalent metal cation selected from the group consisting of $Ag^+$, $Cu^+$, $Tl^{1+}$, $Au^+$, and one trivalent metal cation selected from the group consisting of $Bi^{3+}$, $Sb^{3+}$, $In^{3+}$, $As^{3+}$, $Au^{3+}$, $Y^{3+}$, to make the average valence of the metal cation to be 2+;

X is F, Cl, Br or I;
l is 1-4;
m is 0-5; and
n is 1-6;
wherein the positions of $R^2$ and $(Ar)_m$ on the thiophenyl ring can be exchanged.

DETAILED DESCRIPTION

Figure 1:
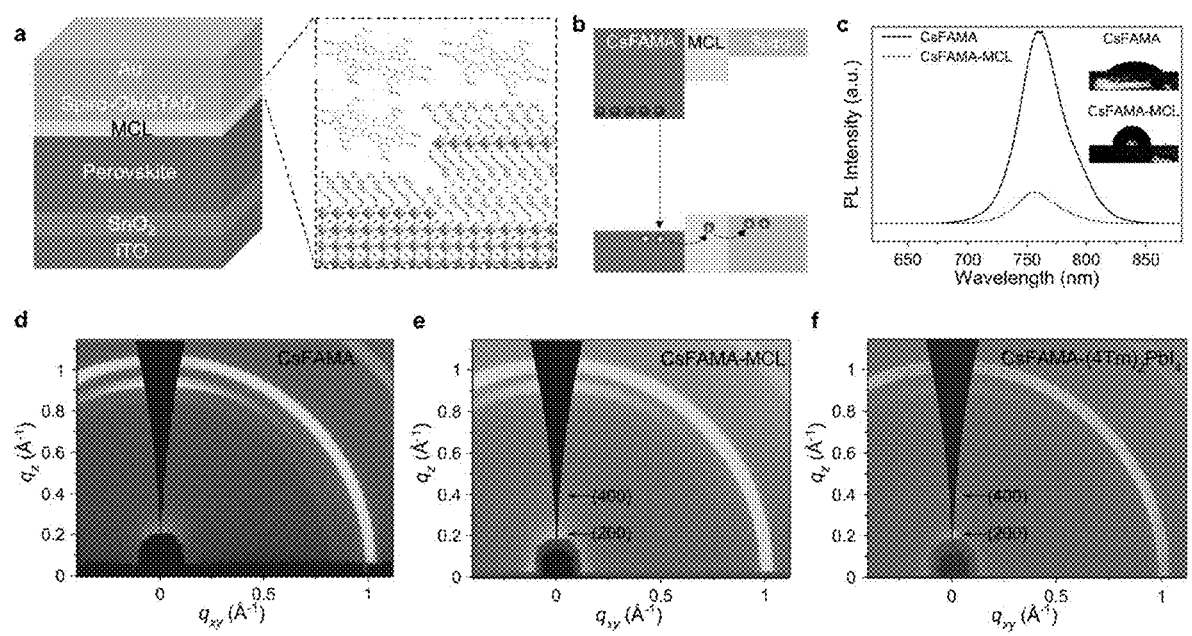
FIG. 1 shows device structure and surface characterization a perovskite solar cell of the present disclosure. a, Left, the structure of a n-i-p perovskite solar cell based on MCL modified interface between perovskite and Spiro-OMeTAD. Right, schematic structure of the MCL structure. b, Proposed energy-level scheme and charge transfer direction for CsFAMA device with MCL. c, Steady-state PL of CsFAMA films with and without MCL. Inset, the water contact angel of CsFAMA film and CsFAMA-MCL film. d-f, GIWAXS patterns of the CsFAMA films without (d) and with (e) MCL, and the CsFAMA film with thick 2D capping layer (f).

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Large conjugated organic ligands, such as oligothiophene, preserve the hydrophobicity that other insulating molecules possess. On the other hand, the semiconducting properties of conjugated ligands are expected to optimize the interfacial energy band structure and reduce the barrier to charge transfer. Considering the multiple functionalities of conjugated ligands, this disclosure has provided an organic halide salt, 2-(3''',4'-dimethyl-[2,2':5',2'':5'',2'''-quaterthiophen]-5-yl)ethan-1-ammonium iodide (4Tm), for post-treatment of the perovskite surface to facilitate charge extraction, improve energy band alignment, reduce interface recombination, and stabilize the perovskite lattice. The conjugated ligand capping treatment shows a high degree of tolerance to external stimuli such as heat, light, and moisture. Facilitated by these properties, a triple cation perovskite solar cell with a power conversion efficiency of 22.06% has been developed. This disclosure further shows that this multifunctional conjugated ligand helps to suppress phase segregation and inhibit ion migration in the PSCs, thus leading to improved long-term stability under illumination.

Design and Formation of 4Tm Capping Layer

The device structure adopted in this disclosure and the multifunctional capping layer (MCL) constructed with conjugated ligands are illustrated in FIG. 1a. 4Tm is selected as the conjugated ligand to be introduced between perovskite and HTL, due to its suitable highest occupied molecular orbital (HOMO) level (~−5.3 eV) that serves as a competent material for gradient hole transport (FIG. 1b). The designed 4Tm molecule contains an ammonium functional group which allows it to form strong ionic and hydrogen bonds with the perovskite surface and composes into a densely packed ligand layer, or even two-dimensional (2D) perovskite layer as discussed below. The triple cation perovskite with a composition of $Cs_{0.05}(FA_{0.87}MA_{0.13})_{0.95}Pb(I_{0.87}Br_{0.13})_3$ (referred to as CsFAMA; FA, formamidinium; MA, methylammonium) is used in this study. The MCL is formed simply by spin coating a solution of 4Tm on the perovskite surface. To confirm the successful formation of MCL, water contact angles of pristine CsFAMA and CsFAMA-MCL films were measured. The contact angle increases from 41° for pristine CsFAMA to 90° for CsFAMA-MCL films (inset of FIG. 1c). This observation indicates that the 4Tm ligands pack on CsFAMA surface with good coverage, thus dramatically improving the hydrophobicity of the film. As a proof-of-concept, we used the steady-state photoluminescence (PL) to roughly assess the carrier behavior in CsFAMA films with MCL. The PL intensity of CsFAMA at 755 nm is significantly quenched upon introducing 4Tm to the surface of CsFAMA (FIG. 1c), indicating a potential type II junction is formed and efficient charge carrier transfer from CsFAMA to the MCL occurs.

The top-view scanning electron microscope (SEM) images show the morphology of the CsFAMA surface has negligible differences between pristine film and film with MCL, which indicates well-maintained morphology after surface modification process. The x-ray photoelectron spectroscopy (XPS) measurements have been performed to probe the composition and interactions on CsFAMA surface before and after MCL modification. The appearance of the S 2p signal at 164.8 eV confirmed the existence of 4Tm on perovskite surface. Angle-dependent XPS provides additional insights into the compositions as a function of depth and reveals that the 4Tm is primarily localized at the film surface. The XPS pattern of Pb 4f for CsFAMA contains two main peaks, $4f_{7/2}$ and $4f_{5/2}$, located at 138.6 eV and 143.5 eV, respectively. The slight shift of Pb peaks toward lower energy by ca. 0.1 eV reflects the decreased work function of the CsFAMA-MCL film surface, which may partly be attributed to p-type doping near the perovskite surface. The $Pb^0$ peaks at 137.2 eV and 142.0 eV are suppressed in CsFAMA-MCL sample, which demonstrates the improved stability and decrease in $Pb^0$ defects on the perovskite surface after MCL modification. The halide/Pb atom ratio in pristine CsFAMA and MCL modified samples are estimated by the integrated area of corresponding peaks. The slight increase in halide/Pb atom ratio in CsFAMA-MCL sample could arise from the formation of a reduced dimensionality phase near the CsFAMA surface.

We attempted to probe the surface structure change using UV-vis absorption, X-ray diffraction (XRD) and 2D grazing-incidence wide-angle X-ray scattering (GIWAXS). While the thin surface layer did not introduce a discernable structure change in UV-vis absorption and XRD patterns, the low dimensional phase was evidenced by the GIWAXS patterns (FIG. 1d,1e). Compared to the control sample, a weak signal at $q_z$ of 0.20 $ç^{-1}$ for film with MCL indicates the formation of 2D perovskite. Because of the specific molecular design of this conjugated ligand, 4Tm not only anchors to the CsFAMA surface, but also inserts into the perovskite lattice by replacing organic cations, thus eventually leading to the formation of 2D perovskite layers. Interestingly, both mechanisms have been shown to be effective in passivating perovskite surface or reducing surface recombination for perovskite solar cells. The formation of 2D perovskite layer can be seen more distinctly by extending the reaction time between the 4Tm solution and the perovskite surface (FIG. 1f). For example, a thick but discontinuous 2D layer was observed upon dipping CsFAMA films into a 4Tm solution for ~6 min. Similar PL quenching effect was observed in the film with such discontinuous thick 2D capping layer, which reveals similar carrier extraction behavior. Here, for our spin-coated 4Tm layer, the contact time between the free 4Tm ligands and the perovskite film surface is quite short and there is no evidence that the 2D perovskite layer is continuous. Therefore, we propose that the MCL is a combination of 4Tm molecular layer and thin 2D perovskite $(4Tm)_2PbI_4$ layer, both of which are able to extract carriers effectively from perovskite (FIG. 1a).

Optical and Electronic Properties of Perovskite Films

Figure 2:
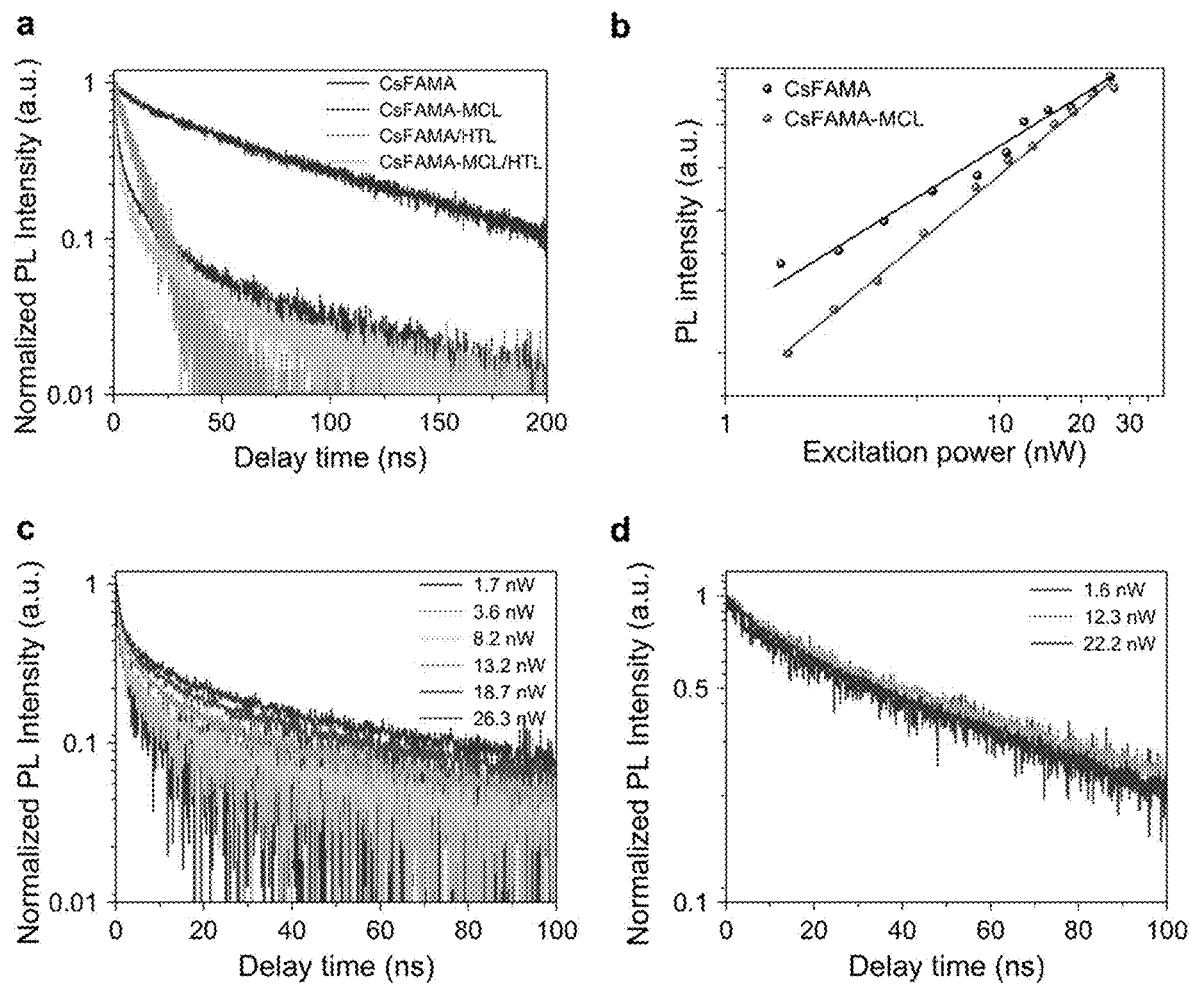
FIG. 2 shows optical characterization of perovskite films. a, TRPL decay curves for the pristine CsFAMA film, CsFAMA-MCL, Spiro-OMeTAD coated CsFAMA film and Spiro-OMeTAD coated CsFAMA-MCL film. b, PL intensities of CsFAMA film and CsFAMA-MCL film, as a function of excitation power. c, TRPL decay curves of CsFAMA- MCL films as a function of excitation power. d, TRPL decay curves of CsFAMA films as a function of excitation power.

The time-resolved photoluminescence (TRPL) spectra of CsFAMA films with and without MCL were collected to probe the carrier dynamics in the perovskite films on glass substrates (FIG. 2a). The nearly mono-exponential decay from pristine CsFAMA film indicates the high quality of the perovskite film. By contrast, the fast-initial decay from the CsFAMA-MCL film is subjected to either the loss of carriers at the interface due to charge extraction to the MCL, or the interface recombination induced by the 4Tm modification process. The second slow decay, which shows similar decay kinetics between pristine CsFAMA and CsFAMA-MCL, could be attributed to the unaltered surface/interface recombination feature with the addition of MCL.

In order to distinguish the contribution of charge extraction processes to the fast-initial decay of PL intensity, we conducted excitation power-dependent steady-state PL and TRPL measurements. PL quenching effects are observed in CsFAMA-MCL film across all different excitation powers (FIG. 2b). The reduced quenching effect upon increasing excitation power, suggests the speed up of radiative recombination and the saturation of extracted charge carrier density. Excitation power-dependent TRPL studies further unveils the underlying carrier behavior. It has been reported that bimolecular recombination process dominates the charge dynamics under high excitation power, while the monomolecular trap-assisted or surface recombination starts to take the role after decreasing excitation powers. Therefore, at sufficiently low excitation power, mono-exponential PL decay is usually observed in neat perovskite films, resulting in longer PL lifetime, as illustrated in FIG. 2d. The PL decay curves of pristine CsFAMA film does not vary considerably with the excitation power (only slight shorter lifetime at highest excitation power), suggesting the selected excitation powers are in the range of identifying the trap-assisted recombination process. On the contrary, the bi-exponential decay in the CsFAMA-MCL films remains to be pronounced and clearly distinguishable even under low excitation power, demonstrating the charge extraction process takes the lead role in the fast-initial decay (FIG. 2c). The slight increase in lifetime and smeared initial decay upon increasing excitation power could be a consequence of charge accumulation at the interface without further extraction from the system. These results confirm that the PL quenching in the CsFAMA-MCL films is indeed from efficient charge extraction but new non-radiative pathways.

In addition, the CsFAMA-MCL film even possess a faster initial PL decay and a longer tail than that of the Spiro-OMeTAD (2,2',7,7'-tetrakis(N,N-dip-methoxyphenylamine)-9,9'-spirobifluorene) coated perovskite, which serves as a typical HTL (the orange curve in FIG. 2a). The shape of the decay curve is relevant to the density of charges that can be stored in charge extraction layers and the interface recombination rates. Comparing with the interface contact between perovskite and Spiro-OMeTAD, the MCL possesses stronger bonding with the perovskite surface both physically and electronically, that facilitates more efficient charge extraction (evidenced by the fast decay component) and reduces interface recombination rate (evidenced by the slow decay component).

Figure 3:
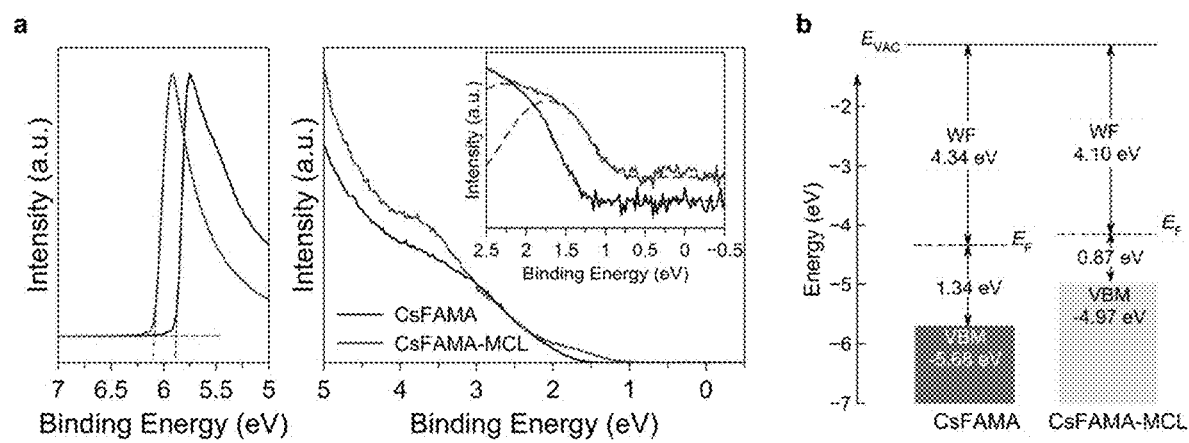
FIG. 3 shows energy-level characterization of CsFAMA with MCL. a, UPS spectra (using H Lyman-α photon source with a photon energy of 10.2 eV) of the pristine CsFAMA film and film with MCL. The left panel shows the secondary electron cut off region. The right panel shows the UPS spectra in the valence band region, in which the Gaussian fit is used to determine the position of the valence band maximum (VBM). The VBMs for perovskite surface was determined from semi-log plots. b, Energy level scheme of the pristine CsFAMA film and film with MCL based on the parameters derived from UPS.

We further compared the surface electronic structure of CsFAMA and CsFAMA-MCL films by work function (WF) and valence band maximum (VBM) measurements using UV photoelectron spectroscopy (UPS, FIG. 3a). We observed a 230 meV decrease in the work function with respect to the vacuum level ($E_{VAC}$), and a 470 meV decrease in the gap between the Fermi energy and VBM after MCL modification. The corresponding energy-level diagrams are schematized in FIG. 3b. This energy level characterization indicates that the surface of CsFAMA shifts from n-type to more p-type after MCL modification, which is likely attributable to the combined effect of conjugated ligand-induced energy-level shift and the suppression of $Pb^0$ species on surface. The p-type perovskite surface is beneficial for promoting charge transfer between perovskite and p-type doped Spiro-OMeTAD. Moreover, the increased VBM of CsFAMA-MCL surface (from −5.68 eV to −4.97 eV) significantly reduces the energetic mismatch between the transport states in Spiro-OMeTAD and the perovskite, which would minimize the hole extraction barrier at HTL/perovskite interface.

PV Performance of 4Tm Treated Perovskites

Figure 4:
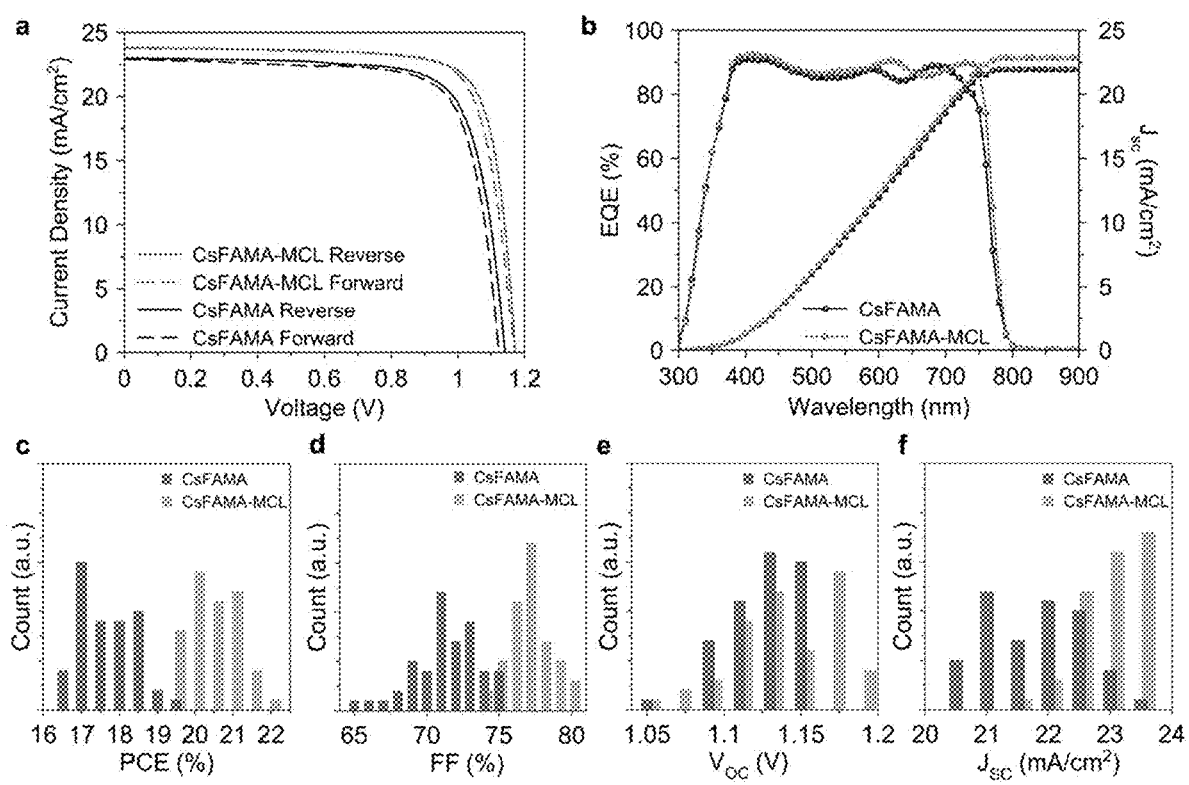
FIG. 4 shows solar cell device performance analysis. a, J-V characteristics of the champion devices based on the CsFAMA and CsFAMA-MCL. b, EQE spectra of the champion devices and the integrated photocurrent density, integrated over the AM1.5 (100 mW cm$^{-2}$) solar spectrum. c-f, Histograms showing the PCE (c), FF (d), $V_{OC}$ (e) and $J_{SC}$ (f) values obtained from 50 CsFAMA and 50 CsFAMA-MCL devices.

We fabricated n-i-p planar heterojunction perovskite solar cells with an ITO/SnO$_2$/CsFAMA perovskite/Spiro-OMeTAD/Au architecture. The champion device with MCL achieved a PCE of 22.06%, with an open circuit voltage ($V_{OC}$) of 1.17 V, a short circuit current ($J_{SC}$) of 23.78 mA/cm$^2$, and a fill factor (FF) of 79.05% (FIG. 4a). No obvious hysteresis is shown in the current density-voltage (J-V) curve under reverse and forward scans, indicating good stability induced by MCL. Additionally, the maximum power point (MPP) tracking at voltage of 1 V reveals a stable power output, with a stabilized PCE of 21.43%. In contrast, the control device delivered a PCE of 19.94% with a $J_{SC}$ of 22.96 mA/cm$^2$, an $V_{OC}$ of 1.14 V and a FF of 75.83%. The $J_{SC}$ values obtained through J-V measurements under solar simulator were verified by the external quantum efficiency (EQE) spectra (FIG. 4b). The statistical distribution of PCE values from 50 control devices and 50 devices with MCL modification demonstrates the reproducibility of the performance enhancement associated with the 4Tm surface treatment, especially the enhancement in all photovoltaic parameters including FF, $J_{SC}$ and $V_{OC}$ (FIG. 4c, d, e, f).

Unlike other methods using insulating materials for surface modification of perovskite solar cells, we found that the perovskite devices are tolerant to the capping layer. We have introduced the capping layer at sufficiently high loading levels of 4Tm, through increasing ligand concentration or extending reaction time, without compromising charge transport. For example, the concentration of 4Tm solution was tuned from 0.1 mg/mL to 0.5 mg/mL. While low concentrations didn't show an obvious impact on device performance, higher concentrations of 4Tm always result in improved device performance without appreciable variation with 4Tm concentration. Considering the factor of 4Tm's low solubility in non-polar solvents, a concentration of 0.25 mg/mL is selected to achieve reproducible high-performance devices. Similarly, increasing the reaction time of 4Tm on the CsFAMA surface, as described earlier, did not introduce significant barriers for charge transfer. Instead, an enhancement in PCE was also observed in devices that have been dipped in 4Tm solution for 6 min, implying the unique electronic property of 4Tm capping layer.

Figure 7:
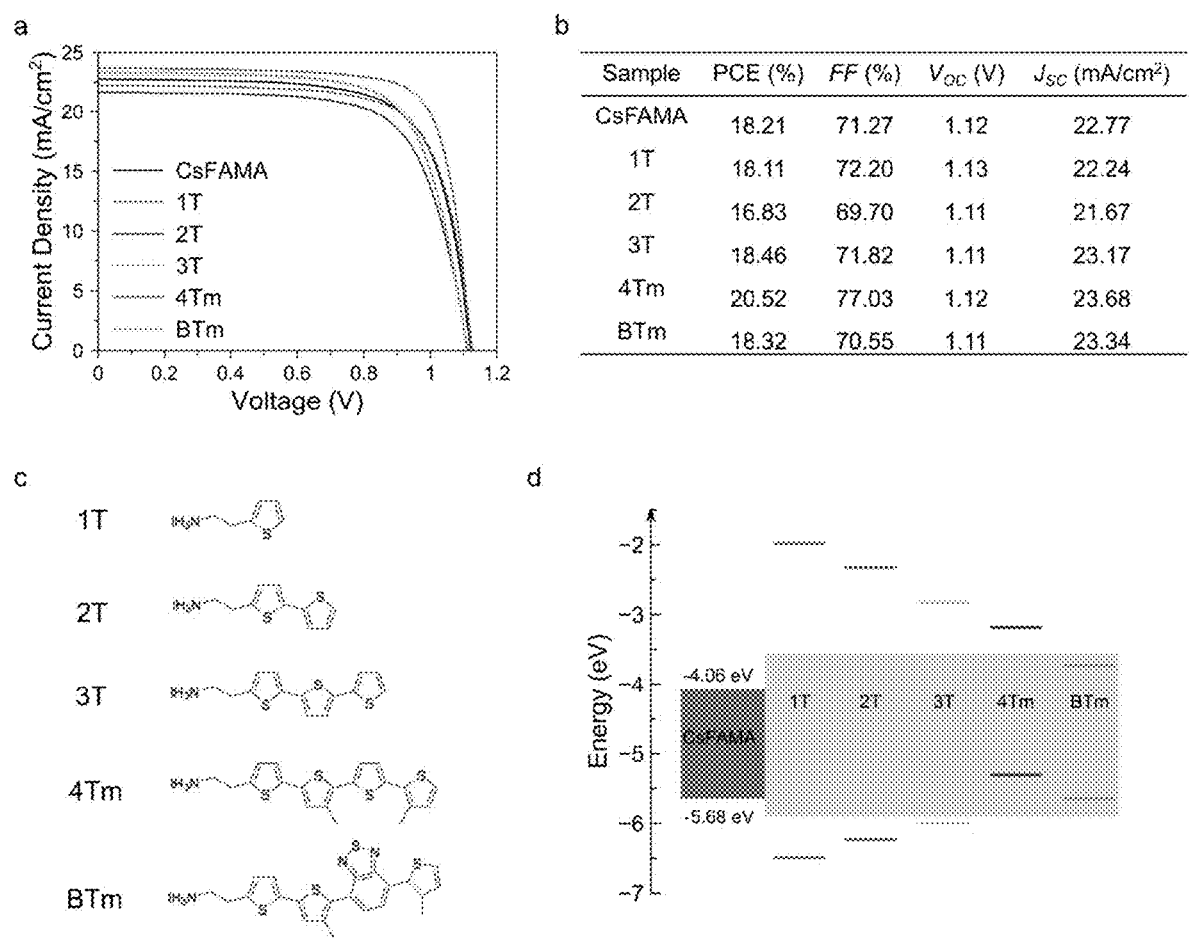
FIG. 7 shows J-V characteristics of perovskite devices base on CsFAMA solar cells modification with different ligands. (a) J-V curves of devices modified with different semiconducting organic molecules. (b) Summary of photovoltaic parameters obtained from corresponding J-V curves. (c) Chemical structures of applied semiconducting organic molecules. (d) Energy level diagram of CsFAMA and different semiconducting organic molecules. The light blue area indicates the valence band and conduction band of inorganic slab in 2D perovskite. The relative energy levels of 1T and 3T are estimated from the literature and the PL emission of corresponding 2D perovskites. Due to the misalignment of energy levels, 1T, 2T, 3T and BTm ligands are not able to efficiently facilitate hole transfer between perovskite and HTL as 4Tm.
Figure 8:
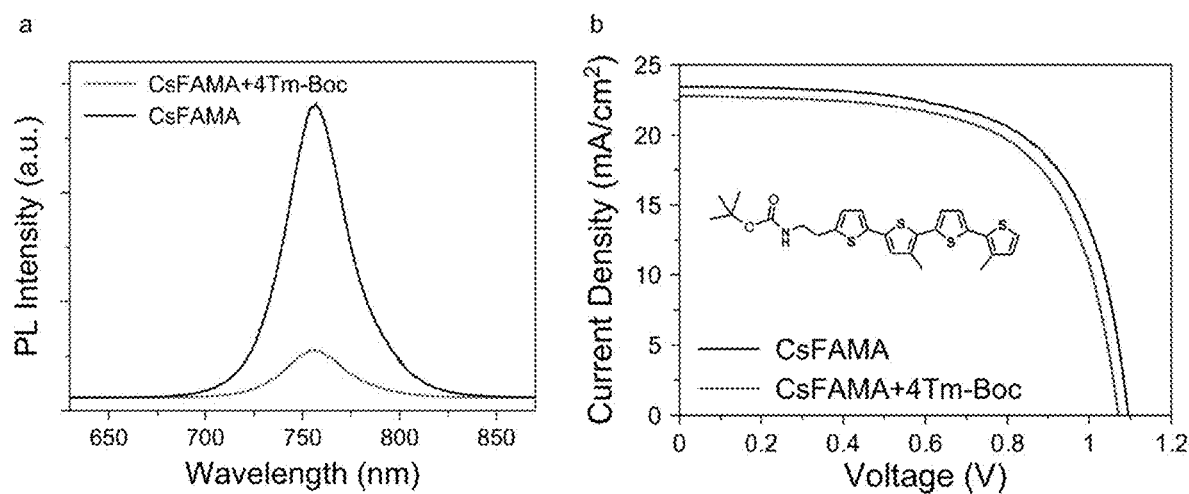
FIG. 8 shows devices characterization of CsFAMA modified with 4Tm-Boc. (a) The steady-state PL spectrum of CsFAMA films before and after 4Tm-Boc coating. The PL quenching effect after 4Tm-Boc coating indicates the hole extraction process from perovskite to 4Tm-Boc. (b) The J-V curve of 4Tm-Boc modified CsFAMA solar cell devices. inset, chemical structure of 4Tm-Boc. Without ammonium functional group, 4Tm-Boc is not able to anchor on perovskite lattice and packs into well-organized molecular layer. Even though the holes can be extracted from perovskite to 4Tm-Boc, the thick ligand layer is not beneficial in charge transfer between perovskite and HTL, thus decreased efficiency after 4Tm-Boc coating is observed.

The 4Tm ligand is composed of an oligothiophene tail and an ammonium functional group. To further identify how each component contributes to the efficiency enhancement, we fabricated solar cell devices with different thiophene moieties and different head groups. The detailed J-V characteristics are shown in FIG. 7 and FIG. 8. Mono-, bi-, and ter-thiophene are denoted as 1T, 2T and 3T, which have wide bandgaps. Another quaterthiophene with a smaller bandgap and lower lowest unoccupied molecular orbital (LUMO) level than 4Tm is denoted as BTm (FIG. 7). No distinct improvement or even decrease of efficiencies of these devices compared with control devices are observed, and we infer these effects as a result of the unfavorable energy alignment that increases interface recombination, which demonstrates the critical role of improved energy alignment achieved with 4Tm ligand. On the other side, the ammonium head group on 4Tm ligand is replaced with carbamate (denoted as 4Tm-Boc), which doesn't have the preferential ionic and hydrogen bonds with perovskite surface. Although the 4Tm-Boc coated perovskite film also possesses enhanced charge extraction, as indicated by steady-state PL quenching, the efficiency of the 4Tm-Boc modified solar cell does not improve (FIG. 8). We hypothesize that the densely-packed and well-oriented 4Tm ligands on the perovskite surface help to stabilize the surface lattice, and the hydrophilic head group together with hydrophobic oligothiophene tail forms a bridge between hydrophilic perovskite and hydrophobic HTL materials, thus further improve the interfacial contact in the devices.

Mechanism of Improved Efficiency

Figure 5:
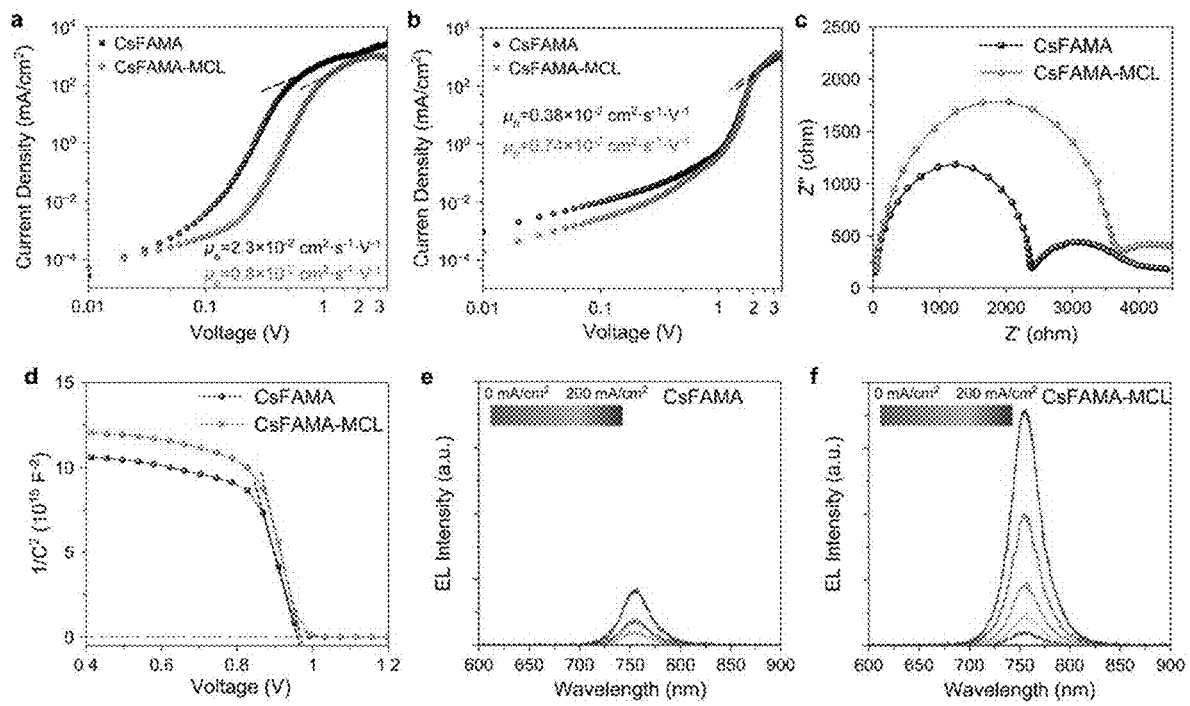
FIG. 5 shows carrier dynamics analysis of photovoltaic devices. a, Current-Voltage curves of electron-only devices for CsFAMA and CsFAMA-MCL devices. b, Current-Voltage curves of hole-only devices for CsFAMA and CsFAMA-MCL devices. c, Nyquist plots of CsFAMA and CsFAMA-MCL devices at MPP voltage in the dark, indicating the recombination resistance at interface. d, Mott-Schottky plots of CsFAMA and CsFAMA-MCL devices at 5 kHz. e-f, EL spectra of solar cells devices based on CsFAMA (e) and CsFAMA-MCL (f) under different injection current densities.

We sought to evaluate the dominant mechanism underpinning the efficiency improvement in devices with MCL using a series of characteristic methods. The light-intensity-dependent $V_{OC}$ plot of CsFAMA and CsFAMA-MCL devices implies slightly suppressed non-radiative recombination in CsFAMA-MCL device. To further elucidate the charge transport behavior in the CsFAMA-MCL devices, we performed space-charge-limited-current (SCLC) measurements on both electron-only devices and hole-only devices to probe the electron and hole mobility in each device. The MCL modification decreased the electron mobility of the cells from $2.3 \times 10^{-2}$ cm$^2 \cdot$s$^{-1} \cdot$V$^{-1}$ to $0.8 \times 10^{-2}$ cm$^2 \cdot$s$^{-1} \cdot$V$^{-1}$, which is ascribed to the electron blocking effect of 4Tm ligand (FIG. 5a). In contrast, the hole mobility in the CsFAMA-MCL devices is about twice that of the CsFAMA device, which suggests the hole transfer between perovskite and HTL is effectively facilitated by 4Tm (FIG. 5b). FIG. 5c shows the Nyquist plots of the CsFAMA and CsFAMA-MCL devices obtained through electrochemical impedance spectrometry (EIS) measurements. The middle frequency zone of the EIS semicircle is dominated by the recombination resistance in high-performance devices, in which the charge transport resistance is negligible. These plots directly demonstrate the increased recombination resistance and reduced recombination rate at the interface in the device with MCL, thus further confirming our hypothesis of a high-quality interface in 4Tm modified devices. Moreover, the MCL increased the flat-band potential of the perovskite solar cells by 0.01 V, as indicated in the Mott-Schottky plots (FIG. 5d). This result is associated with the improvement in $V_{OC}$ of CsFAMA-MCL device compared with CsFAMA device.

In addition, we also measured the electroluminescence (EL) spectra of both the CsFAMA and CsFAMA-MCL solar cells, operating as light-emitting-diodes. As shown in FIG. 5e and FIG. 5f, the CsFAMA-MCL devices achieved significantly higher EL intensity under the same injection current compared with the CsFAMA devices, owing to the improved interface and efficient charge transfer.

Impact of 4Tm on Device Stability

Figure 9:
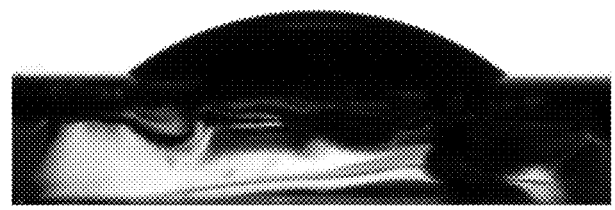
FIG. 9 shows water contact angle measurements. Water contact angle of (a) pristine CsFAMA film, (b) CsFAMA-MCL film and (c) CsFAMA film capped with 4Tm-Boc. The water contact angles were measured around 1 s after the water drop. The pristine CsFAMA film exhibits a more hydrophilic surface with a contact angle of 41°, while the CsFAMA-MCL and CsFAMA-4Tm-Boc surface show dramatic increase in contact angle, both with a number of 90°. The hydrophobic tail of 4Tm ligand contribute to this large contact angle.
Figure 9:
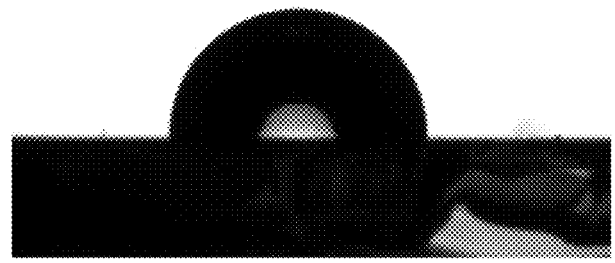
Figure 9:
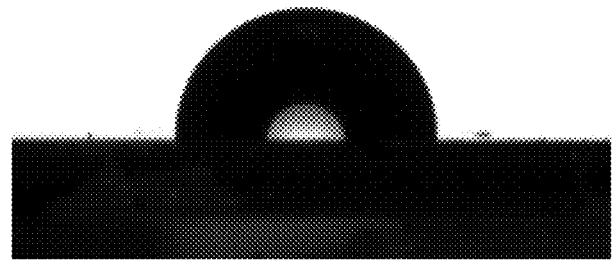

The CsFAMA-MCL thin film exhibited stronger water stability and the larger water contact angle, as mentioned earlier (FIG. 9). This strong water repelling property is related with the hydrophobic thiophene tail of the 4Tm ligand. The long tail also slows down the air-induced decomposition, as illustrated through the suppression of $Pb^0$ peaks in XPS. However, besides moisture and air instability, the stimuli such as light and heat are still present issues.

Ion migration is another critical issue that limits the stability of perovskite solar cells and cannot be resolved by encapsulation. Light-induced ion migration will further cause changes in composition and morphology, which create electronic traps in the devices. Phase segregation in mixed halide perovskites is one of the significant consequences of ion migration. Our CsFAMA film has an optical bandgap of 1.62 eV (extracted from EQE spectrum), which is at the higher end of conventional perovskite solar cells with a bandgap of 1.5-1.6 eV. The wider bandgap increases its potential application in tandem solar cells, but compels it to suffer light-induced phase segregation more significantly than narrow bandgap perovskites. Here, interestingly, we found that the CsFAMA-MCL thin films exhibit extraordinary stability and suppressed light-induced phase segregation. Time-dependent PL measurements of CsFAMA films were carried out in air during continuous illumination under white light with 1-sun intensity. For pristine CsFAMA film, the PL peak of perovskite exhibits an obvious red shift within 10 min, which indicates the formation of low bandgap I-rich domains (FIG. 6a).

Figure 6:
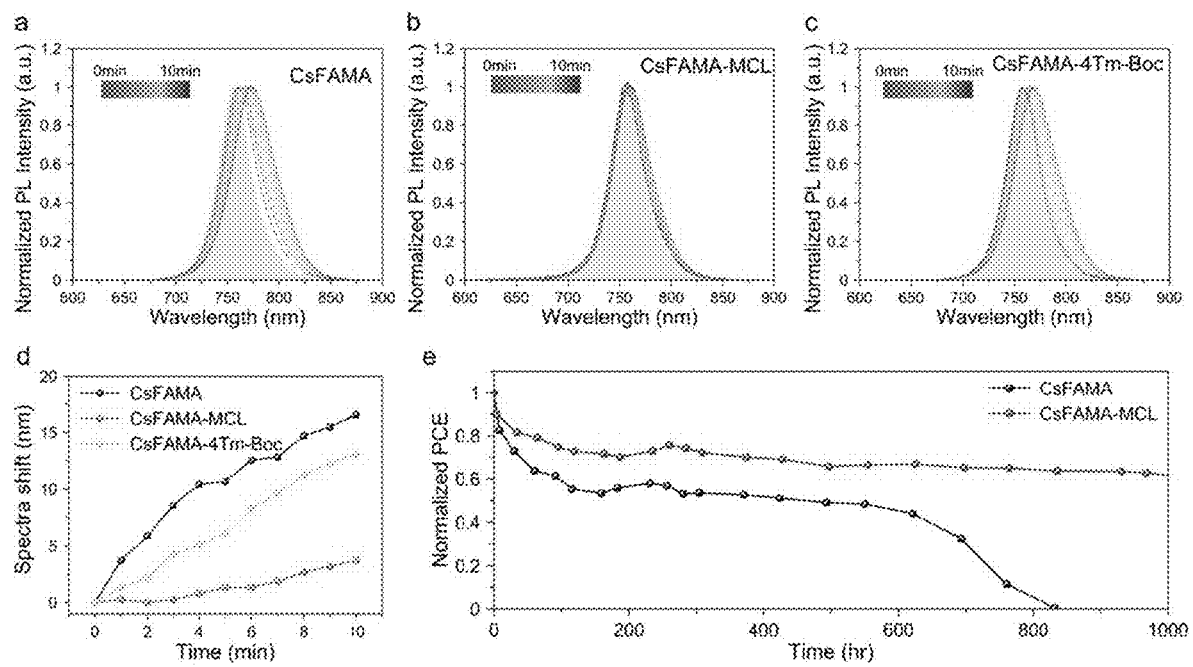
FIG. 6 shows suppression of photoinduced phase segregation in triple-halide perovskite and long-term stability. a-c, PL spectra of pristine CsFAMA film (a), CsFAMA-MCL film (b) and CsFAMA film modified with 4Tm-Boc (c) under illumination for 10 min. Grey areas indicate the initial PL spectra. d, The shift of the spectral centroids of CsFAMA film, CsFAMA-MCL film and 4Tm-Boc modified CsFAMA film over time. e, Stability tests of unencapsulated solar cell devices with or without MCL exposed to continuous light (100 mW cm$^{-2}$) under open-circuit condition.

In contrast, the CsFAMA-MCL thin film show a minimal shift in the PL maximum, demonstrating its excellent photostability (FIG. 6b). This phase segregation evolution was also observed in PL images. The time-dependent PL images of pristine CsFAMA film exhibit evolution of heterogeneity upon light illumination, indicating the formation of narrow band-gap domains that serve as a trap for electron and hole and cause PL quenching. The homogenized PL images from CsFAMA-MCL film implies uniformity across the whole film.

In addition, charge-discharge experiments also reveal faster discharge processes in CsFAMA-MCL solar cells, further verifying the reduced ion migration in the CsFAMA-MCL film. The phase segregation of mixed halide perovskite has been reported to be suppressed by removing excess photogenerated electrons and holes with charge extraction. However, for CsFAMA with 4Tm-Boc capping layer which possesses the same charge extraction behavior as 4Tm (structure shown in FIG. 8b), we didn't observe such distinct suppression of PL shift as 4Tm salt did (FIG. 6c and FIG. 6d). We thus conclude that the significant lattice stability induced by the primary ammonium group of 4Tm anchoring on perovskite surface lattice is one critical factor of phase segregation suppression.

We carried out long-term stability test of devices under continuous light illumination with 1-sun intensity in an $N_2$ environment, without temperature control to simulate normal operating conditions. Lithium-doped Spiro-OMeTAD is applied as HTL in the stability tests to further investigate the influence of lithium-dopant migration on the device stability. At open circuit condition, the CsFAMA-MCL device exhibits a stable post burn-in efficiency (FIG. 6e) after 1000 hrs. In contrast, the CsFAMA control device shows a shorter lifetime. The burn-in effect in both control and CsFAMA-MCL devices has been reported in previous works, especially for the devices tested under illumination at open circuit condition, due to the excess charge carriers accumulation. Cation migration in wide-bandgap perovskites and elevated temperature in chamber without consistent $N_2$ flow can exaggerate the burn-in phenomena. In addition, it is noted that the J-V curve of CsFAMA control device shows an s-kink after long time illumination, which is usually ascribed to the charge extraction barrier at the interface between active layer and charge extraction layer. In contrast, a smooth J-V curve is maintained for the CsFAMA-MCL device with small hysteresis even after 1000 hours of continuous illumination. This indicates the well-preserved interface quality during operation. We attribute this excellent photostability to the unique properties of 4Tm including efficient charge extraction, lattice anchoring effect, and bridging effect between perovskite and HTL, which introduce a structurally- and electronically-robust interface.

Discussion

We have demonstrated the multi-roles of the conjugated ligands, particularly 4Tm, at the perovskite surface in enhancing solar cell efficiency and improving device stability. 4Tm interface treatment can efficiently extract holes, tune the WF and VBM of perovskite surface for significantly improved band alignment, increase hole mobility, reduce the interface recombination rate and stabilize the perovskite lattice and the interface between perovskite and HTL, simultaneously. As a result of these superior properties, CsFAMA-MCL-based solar cell achieves a high efficiency of 22.06% with good operational stability and suppressed phase segregation. Our strategy provides a practical method of interface modification that is insensitive to the modification process and represents a new path to overcome the challenging problem of including insulating molecules during surface modification. In addition, the tunability of WF and VBM allows the use of a wider range of HTL materials. Further investigation into conjugated ligand design will likely be critical for achieving minimal loss at interfaces and approaching the potential theoretical efficiency of polycrystalline perovskite devices with excellent intrinsic stability.

Materials. All regents were used as received without further purification. Chemicals used include $PbI_2$ (Sigma-Aldrich), $PbBr_2$ (Sigma-Aldrich), FAI (GreatCell Solar), MABr (GreatCell Solar), CsI (Sigma-Aldrich), 2,2',7,7'-tetrakis[N,N-bis(p-methoxyphenyl) amino]-9,9'-spirobifluorene (Spiro-OMeTAD, Feiming Chemical Limited), 4-tert-butylpyridine (tBP, Sigma-Aldrich), bis(trifluoromethane)sulfonimide lithium salt (Li-TFSI, Sigma-Aldrich), $SnO_2$ (15% in $H_2O$ colloidal dispersion, Alfa Aesar), Chlorobenzene (CB, Sigma-Aldrich), N,N-dimethylformamide (DMF, Sigma-Aldrich), dimethyl sulfoxide (DMSO, Sigma-Aldrich), isopropanol (IPA, Sigma-Aldrich), acetonitrile (AcN, Sigma-Aldrich), and Gold pellets (99.999%, Kurt J. Lesker). 2-(3'''',4'-dimethyl-[2,2':5',2'':5'',2'''-quaterthiophen]-5-yl)ethan-1-ammonium iodide (4Tm) were synthesized based on our previous report, Gao, Y. et al. Molecular engineering of organic-inorganic hybrid perovskites quantum wells. *Nat. Chem.* 11, 1151-1157 (2019), the content of which is incorporated in whole in this disclosure.

Device Fabrication. The ITO substrate was washed with water, acetone, isopropanol sequentially, and then treated with UVO-zone for 30 min before use. The $SnO_2$ layer was span coated onto the ITO substrate with a $SnO_2$ nanocrystal suspension (diluted to 1.67% from 15% stock solution) at 3,000 r.p.m. for 35 s and subsequently annealed at 150° C. for 30 min in air. To prepare the CsFAMA precursor solution, the $FAPbI_3$ (100 mg FAI and 324 mg $PbI_2$) and $MAPbBr_3$ (30 mg MABr and 116 mg $PbBr_2$) were dissolved in 468 µL, and 211 µL, of DMF/DMSO mixed solvent (v/v 4/1), respectively. After fully dissolved, the final CsFAMA precursor solution was prepared by mixing 468 µL, of FAPbI$_3$ solution, 93.6 µL, of MAPbBr$_3$ solution, and 28.2 µL of CsI solution (398 mg/mL in DMSO) under stirring at 60° C. for at least 1 hr before using. As fabricated SnO$_2$ was treated with UVO-zone for 20 min just before the CsFAMA layer deposition, and transferred into glove box for the following process. The perovskite layer was fabricated by spin coating 30 µL of CsFAMA precursor solution on SnO$_2$ substrate at a speed of 4,000 rpm for 30 s. 150 µL CB was dropped onto the perovskite layer at 20 s as anti-solvent. The as-casted perovskite film was annealed at 150° C. for 1 min and 100° C. for 60 min. For the 4Tm modified device, the 4Tm solution in CB/IPA mixed solvent (v/v 95/5) was drop casted on perovskite surface at 5,000 rpm, followed by drying at 100° C. for 2 min. We found that with or without post-annealing after 4Tm deposition, the device performance is not affected, and 2D layer formation can occur without thermal annealing. The quick annealing process is applied for drying the solvent. After the substrate is cooling to room temperature, the Spiro-OMeTAD solution [51.5 mg Spiro-OMeTAD in 600 µL CB with 20.28 µL tBP and 11.73 µL Li-TFSI (520 mg/mL in AcN)] was spun onto the perovskite film as a hole transporting layer. The device was aged in air for 16 hrs before the evaporation of 90 nm Au as top electrode to complete the fabrication.

Perovskite Film Characterization. PL images were collected with Olympus microscope coupled with an X-CITE 120Q UV lamp. The steady-state PL spectra were measured using a SpectraPro HRS-300. TRPL spectra were measured by time correlated single photon counting apparatus (PicoQiant). The excitation source of both measurements was used a picosecond pulsed laser at 447 nm. The absorption spectra were obtained by an Agilent UV-vis-NIR Cary-5000 spectrometer. The thin film XRD patterns were measured with a Rigaku Smart Lab using a Cu Kα source (λ=1.54056 ç). The water contact angle was measured with Ramé-hart Model 200. GIWAXS measurements were carried out at beamline 7.3.3 at the Advanced Light Source (ALS) at Lawrence Berkeley National Lab utilizing an incoming X-rays of 10 keV and an incident angle at 0.1°. The scattering intensity was recorded with a Pilatus 2M-2D detector. The SEM images were taken using a FEI Teneo VS SEM at 5 kV and 0.1 nA using a back-scattered electron detector. The UPS measurements were performed with a H Lyman-α photon source (E-LUX™ 121) with a photon energy of 10.2 eV and a 5.85 eV pass energy while the sample was biased at negative 5 V. The XPS measurements were done with a PHI 5600 ultrahigh vacuum system using a hemispherical electron energy analyzer and an Al Kα source (1486.6 eV, PHI 04-548 dual anode X-ray source) for excitation. Core-level signals were obtained at 0°, 45° and 75° electron take-off angles with a 23.5 eV pass energy.

Device Characterization. J-V characteristics were collected with simulated AM1.5G irradiation (100 mW/cm$^2$), produced by a Xenon-lamp-based solar simulator (Enlitech SS-F5-3A). The light intensity was calibrated with a calibrated Si solar cell from Enlitech. A Keithley 2450 SourceMeter was used for driving the J-V measurements. The active area was 0.11 cm$^2$, defined by the Au electrode deposition mask. A voltage scan was measured from 1.2 V to −0.1 V then back to 1.2 V. Scan rate of 0.17 V/s was used with a voltage step of 20 mV. The devices were measured in both nitrogen environment and ambient air environment and no obvious difference has been observed. The EQE measurements were performed at zero bias on equipment built in-house using a preamplifier and a lock-in amplifier at a chopper frequency of 161 Hz. The measurements were calibrated with a reference UV-enhanced Si (818-UV-L) diode. The light intensity (φ)-dependent $V_{OC}$ property was studied based on the relation $V_{OC} \propto (k_B T/q) \ln \varphi$, where $k_B$ is Boltzmann's constant, T is Kelvin temperature, and q is the elementary charge. The electron and hole mobilities were measured from SCLC characterization based on electron-only (ITO/SnO$_2$/perovskite/PCBM/BCP/Au) and hole-only (ITO/PEDOT:PSS/perovskite/Spiro/Au) devices. All devices were measured from 0 to +10 V with step size of 0.02 V under dark condition. The electron and hole mobility values of were calculated by fitting the curve using the Mott-Gurney law in Child's regime using the following equation:

$$J = \frac{9\varepsilon_0 \varepsilon_r \mu V^2}{8L^3}$$

Where L is the thickness of perovskite film, $\varepsilon_r$ (i.e., 25) is the relative dielectric constant, $\varepsilon_0$ is the vacuum permittivity, µ is the charge mobility, V is the applied voltage, and J is the current density. The EIS characterization was performed in the dark at a frequency range 100 kHz to 100 mHz using a Versa STAT elcctrochemical workstation (Ametek). Complete devices were used for measurement in air. Devices were exposed to a forward bias potentials of 900 mV, close to the maximum power point voltage, on which a sinusoidal perturbation of 20 mV was superimposed. For Mott-Schottky analysis, capacitance-voltage measurements were performed at fixed frequency (10 kHz) on complete devices with a scan from 0 V to 1.4 V. The LED devices characterizations were carried out with a Keithley 2450 source-meter and a 100 mm integrating sphere coupled with a spectrometer (Enli Technology, LQ-100X).

Film and Device Stability Measurement

The operational stability tests were carried out at open circuit condition for unencapsulated devices under LED light with solar spectrum. The light intensity was adjusted to 100 mW/cm$^2$. The devices were tested in a glovebox filled with N$_2$, with no temperature control. The estimated device temperature during the test is around 55° C. J-V characteristics were performed over various times to calculate device efficiencies.

In the present disclosure the term "about" can allow for a degree of variability in a value or range, for example, within 10%, within 5%, or within 1% of a stated value or of a stated limit of a range.

In the present disclosure the term "substantially" can allow for a degree of variability in a value or range, for example, within 90%, within 95%, or within 99% of a stated value or of a stated limit of a range.

The term "substituted" as used herein refers to a functional group in which one or more hydrogen atoms contained therein are replaced by one or more non-hydrogen atoms. The term "functional group" or "substituent" as used herein refers to a group that can be or is substituted onto a molecule. Examples of substituents or functional groups include, but are not limited to, a halogen (e.g., F, Cl, Br, and I); an oxygen atom in groups such as hydroxyl groups, alkoxy groups, aryloxy groups, aralkyloxy groups, oxo (carbonyl) groups, carboxyl groups including carboxylic acids, carboxylates, and carboxylate esters; a sulfur atom in groups such as thiol groups, alkyl and aryl sulfide groups, sulfoxide groups, sulfone groups, sulfonyl groups, and sulfonamide groups; a nitrogen atom in groups such as amines, azides, hydroxylamines, cyano, nitro groups, N-oxides, hydrazides, and enamines; and other heteroatoms in various other groups.

Non-limiting examples of substituents, that can be bonded to a substituted carbon (or other such as nitrogen) atom include F, Cl, Br, I, OR, OC(O)N(R)$_2$, CN, NO, NO$_2$, ONO$_2$, azido, CF$_3$, OCF$_3$, R, O (oxo), S (thiono), C(O), S(O), methylenedioxy, ethylenedioxy, N(R)$_2$, SR, SOR, SO$_2$R, SO$_2$N(R)$_2$, SO$_3$R, (CH$_2$)$_{0-2}$P(O)OR$_2$, C(O)R, C(O)C(O)R, C(O)CH$_2$C(O)R, C(S)R, C(O)OR, OC(O)R, C(O)N(R)$_2$, OC(O)N(R)$_2$, C(S)N(R)$_2$, (CH$_2$)$_{0-2}$N(R)C(O)R, (CH$_2$)$_{0-2}$N(R)C(O)OR, (CH$_2$)$_{0-2}$N(R)N(R)$_2$, N(R)N(R)C(O)R, N(R)N(R)C(O)OR, N(R)N(R)CON(R)$_2$, N(R)SO$_2$R, N(R)SO$_2$N(R)$_2$, N(R)C(O)OR, N(R)C(O)R, N(R)C(S)R, N(R)C(O)N(R)$_2$, N(R)C(S)N(R)$_2$, N(COR)COR, N(OR)R, C(=NH)N(R)$_2$, C(O)N(OR)R, or C(=NOR)R wherein R can be hydrogen or a carbon-based moiety, and wherein the carbon-based moiety can itself be further substituted; for example, wherein R can be hydrogen, alkyl, acyl, cycloalkyl, aryl, aralkyl, heterocyclyl, heteroaryl, or heteroarylalkyl, wherein any alkyl, acyl, cycloalkyl, aryl, aralkyl, heterocyclyl, heteroaryl, or heteroarylalkyl or R can be independently mono- or multi-substituted; or wherein two R groups bonded to a nitrogen atom or to adjacent nitrogen atoms can together with the nitrogen atom or atoms form a heterocyclyl, which can be mono- or independently multi-substituted.

The term "aryl" as used herein refers to substituted or unsubstituted cyclic aromatic hydrocarbons that do not contain heteroatoms in the ring. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In some embodiments, aryl groups contain about 6 to about 14 carbons ($C_6$-$C_{14}$) or from 6 to 10 carbon atoms ($C_6$-$C_{10}$) in the ring portions of the groups. Aryl groups can be unsubstituted or substituted, as defined herein. Representative substituted aryl groups can be mono-substituted or substituted more than once, such as, but not limited to, 2-, 3-, 4-, 5-, or 6-substituted phenyl or 2-8 substituted naphthyl groups, which can be substituted with carbon or non-carbon groups such as those listed herein.

A "hetero aryl" represents aromatic ring comprising at least one hetero atom such as N, S, O, or Se. Hetero aryl in the present disclosure may be any hetero aryl. Hetero aryl in the present disclosure may be but is not limited to pyrrolidinyl, azetidinyl, piperidynyl, piperazinyl, morpholinyl, chromanyl, indolinonyl, isoindolinonyl, furanyl, pyrrolidinyl, pyridinyl, pyrazinyl, pyrimidinyl, triazinyl, thiophenyl, tetrahydrofuranyl, pyrrolyl, oxazolyl, oxadiazolyl, imidazolyl, triazyolyl, tetrazolyl, benzoxazolinyl, benzthiazolinyl, benzimidazolinyl groups, or any combination thereof.

The terms "halo," "halogen," or "halide" group, as used herein, by themselves or as part of another substituent, mean, unless otherwise stated, a fluorine, chlorine, bromine, or iodine atom. The compounds described herein may contain one or more chiral centers, or may otherwise be capable of existing as multiple stereoisomers. It is to be understood that in one embodiment, the invention described herein is not limited to any particular stereochemical requirement, and that the compounds, and compositions, methods, uses, and medicaments that include them may be optically pure, or may be any of a variety of stereoisomeric mixtures, including racemic and other mixtures of enantiomers, other mixtures of diastereomers, and the like. It is also to be understood that such mixtures of stereoisomers may include a single stereochemical configuration at one or more chiral centers, while including mixtures of stereochemical configuration at one or more other chiral centers.

Similarly, the compounds described herein may include geometric centers, such as cis, trans, E, and Z double bonds. It is to be understood that in another embodiment, the invention described herein is not limited to any particular geometric isomer requirement, and that the compounds, and compositions, methods, uses, and medicaments that include them may be pure, or may be any of a variety of geometric isomer mixtures. It is also to be understood that such mixtures of geometric isomers may include a single configuration at one or more double bonds, while including mixtures of geometry at one or more other double bonds.

The term "optionally substituted," or "optional substituents," as used herein, means that the groups in question are either unsubstituted or substituted with one or more of the substituents specified. When the groups in question are substituted with more than one substituent, the substituents may be the same or different. When using the terms "independently," "independently are," and "independently selected from" mean that the groups in question may be the same or different. Certain of the herein defined terms may occur more than once in the structure, and upon such occurrence each term shall be defined independently of the other.

The term "perovskite.", for the purpose of this specification, refers to the "perovskite. structure" and not specifically to the perovskite material, CaTiO$_3$. For the purpose of this specification, "perovskite" encompasses and preferably relates to any material that has the same type of crystal structure as calcium titanium oxide and of materials in which the bivalent cation is replaced by two separate monovalent cations. The perovskite structure has the general stoichiometry AMX$_3$, where "A" and "M" are cations and "X" is an anion. The "A" and "M" cations can have a variety of charges and in the original Perovskite mineral (CaTiO$_3$), the A cation is divalent and the M cation is tetravalent. For the purpose of this invention, the perovskite formulae include structures having three or four anions, which may be the same or different, and/or one or two organic cations, and/or metal atoms carrying two or three positive charges, in accordance with the formulae presented elsewhere in this specification.

As shown in FIG. 1. MCL represents a multifunctional molecular layer of $R^1NH_3^+$ and/or a thin layer of two-dimensional (2D) perovskite $(R^1NH_3^+)_2(A^+)_{n-1}(M^{2+})_n(X^-)_{3n+1}$ on top of the said ABX3 perovskite.

In one embodiment, the present disclosure provides a solar cell comprising, from bottom to top, a support layer; an electron transporting layer; a perovskite layer; a capping layer; a hole transporting layer; and a counter electrode layer, wherein the capping layer comprises an organic-inorganic hybrid perovskite of Formula I:

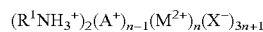

wherein:
($R^1NH_3^+$) represents an asymmetric mono-ammonium cationic moiety:

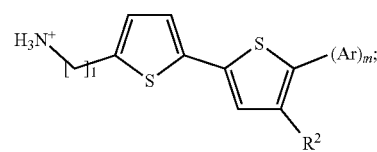

A⁺ represents a cation Cs⁺, Rb⁺, CH$_3$NH$_3^+$, CH$_3$CH$_2$NH$_3^+$, or

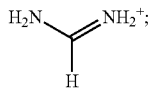

R² is —H, —F, —Cl, —Br, —I, —Me, —Et, —OMe, —OEt, —SMe, —SEt, —CN, —NO$_2$, —COMe, —CHO, —COOMe, or —NH—COMe;

(Ar)$_m$ represents a conjugated and optionally substituted aryl or hetero aryl system, or a combination thereof, wherein each aryl or hetero aryl ring in the conjugated and optionally substituted aryl or hetero aryl system may be same or different;

M²⁺ represents a divalent metal cation Pb²⁺, Sn²⁺, Ge²⁺, Cd²⁺, Zn²⁺, Cd²⁺, Hg²⁺, Ni²⁺, Co²⁺, Fe²⁺, Mn²⁺, Cr²⁺, V²⁺, Pd²⁺, Pt²⁺, or a combination thereof; or a combination of one monovalent metal cation selected from the group consisting of Ag⁺, Cu⁺, Tl⁺, Au⁺, and one trivalent metal cation selected from the group consisting of Bi³⁺, Sb³⁺, In³⁺, As³⁺, Au³⁺, Y³⁺, to make the average valence of the metal cation to be 2+;

X is F, Cl, Br or I;

l is 1-4;

m is 0-5; and n is 1-6;

wherein the positions of R² and (Ar)$_m$ on the thiophenyl ring can be exchanged.

In one embodiment regarding the solar cell, wherein A⁺ is a cation selected from CH$_3$NH$_3^+$, CH$_3$CH$_2$NH$_3^+$, or

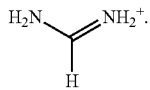

In one embodiment regarding the solar cell, wherein R² is —F, —Cl, —Br, —I, —Me, —Et, —OMe, —OEt, —SMe, —SEt, —CN, —NO$_2$, —COMe, —CHO, —COOMe, or —NH—COMe. In one aspect, R² is —Me.

In one embodiment regarding the solar cell, wherein (Ar)$_m$ represents a conjugated and optionally substituted aryl or hetero aryl system, or a combination thereof, wherein each aryl or hetero aryl ring in the conjugated and optionally substituted aryl or hetero aryl system may be same or different, wherein aryl is phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, naphthyl, or any combination thereof; wherein hetero aryl is pyrrolidinyl, azetidinyl, piperidynyl, piperazinyl, morpholinyl, chromanyl, indolinonyl, isoindolinonyl, furanyl, pyrrolidinyl, pyridinyl, pyrazinyl, pyrimidinyl, triazinyl, thiophenyl, tetrahydrofuranyl, pyrrolyl, oxazolyl, oxadiazolyl, imidazolyl, triazyolyl, tetrazolyl, benzoxazolinyl, benzthiazolinyl, and benzimidazolinyl groups.

In one embodiment regarding the solar cell, wherein (Ar)$_m$ represents a conjugated and optionally substituted aryl or hetero aryl system, or a combination thereof, wherein each aryl or hetero aryl ring in the conjugated and optionally substituted aryl or hetero aryl system may be same or different, wherein Ar is:

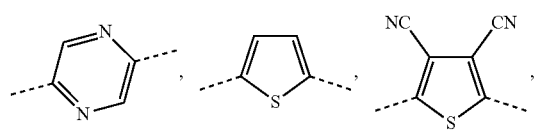

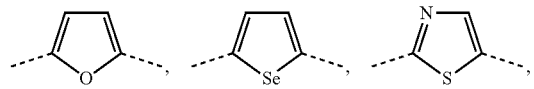

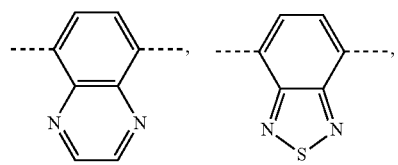

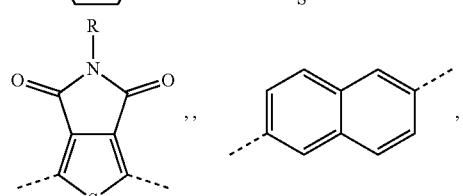

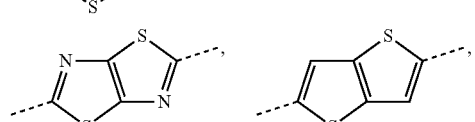

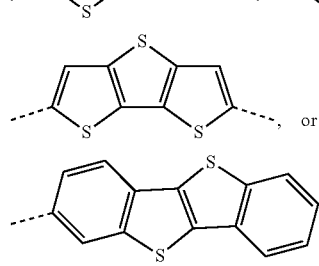

or any combination thereof. The dashed bonds show possible connection between different aryl groups. It should be understood that the bond positions may not be limited to the as-drawn structures. In one aspect, one or more aryl group may be substituted by substituent groups such as —F, —Cl, —Br, —I, —Me, —Et, —OMe, —OEt, —SMe, —SEt, —CN, —NO$_2$, —COMe, —CHO, —COOMe, —NH—COMe, or any combination thereof.

In one embodiment regarding the solar cell, wherein M²⁺ is a divalent metal cation Pb²⁺, Sn²⁺, Ge²⁺, Cu²⁺, Zn²⁺, Cd²⁺, Hg²⁺, Ni²⁺, Co²⁺, Fe²⁺, Mn²⁺, Cr²⁺, V²⁺, Pd²⁺, Pt²⁺ or any combination thereof, and preferably Pb²⁺ or Sn²⁺.

In one embodiment regarding the solar cell, wherein there is only one ammonium (NH$_3^+$) group in Formula I to ensure thiophene monoamine based organic-inorganic hybrid perovskites.

In one embodiment regarding the solar cell, wherein R¹NH$_3^+$ represents asymmetric mono-ammonium cationic moiety.

In one embodiment regarding the solar cell, wherein $R^1NH_3^+$ is:

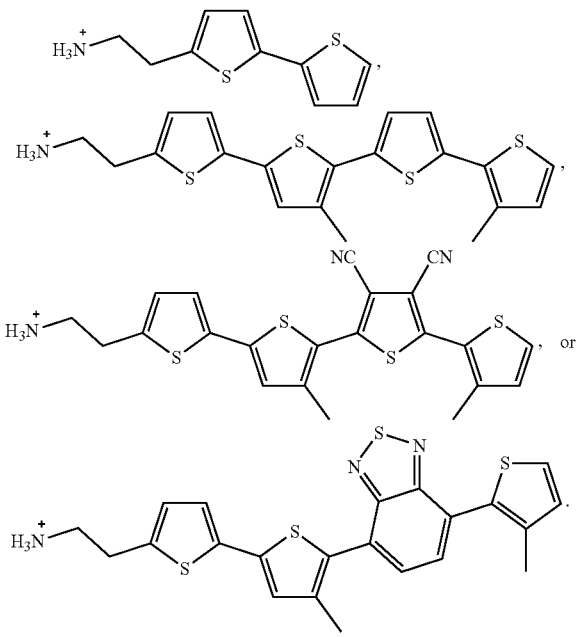

In one embodiment regarding the solar cell, wherein the support layer comprises material selected from but is not limited to indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$, zinc oxide, or any combination thereof.

In one embodiment regarding the solar cell, wherein the electron transporting layer comprises material selected from but is not limited to [6,6]-phenyl-C$_{61}$-butyric acid methyl ester (PCBM), 1,4,5,8,9,11-hexazatriphenylene-hexacarbonitrile (HAT-CN), (C$_{60}$—I$_h$)[5,6]fullerene (C60), (C70-D5h)[5,6]fullerene (C70), [6,6]-Phenyl C$_{71}$ butyric acid methyl ester (PC70BM), 2,9-dimethyl-4,7-diphenyl-1,10-phenanthroline (BCP), 1,3,5-tri(phenyl-2-benzimi-dazolyl)-benzene (TPBI), preferably PCBM, HAT-CN, C60, C70 PC70BM, polyethyleneimine ethoxylated (PETE), poly [(9,9-bis(3'-(N,N-dimethylamino)propyl)-2,7-fluorene)-alt-2,7-(9,9-dioctylfluorene)] (PFN), or metal oxide, wherein the metal oxide is an oxide of a metal selected from a group of metal consisting of Ti, Sn, Cs, Fe, Zn, Nb, SrTi, Si, Ti, Al, Cr, Sn, Mg, Mn, Zr, Ni, or Cu.

In one embodiment regarding the solar cell, wherein the hole transporting layer comprises material selected from but is not limited to triphenylamine. carbazole, N,N,(diphenyl)-N',N'di-(alkylphenyl)-4,4'-biphenyldiamine, (pTPDs), diphenylhydrazone, poly [N,N'-bis(4-butylphenyl)-N,N'-bis(phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9,9'-spirobifluorene) (spiro-OMeTAD), N,N,N',N'-tetraphenylbenzidine (TPD), poly[bis(4-phenyl)(2,4,6-trimethylphenyl)amine (PTAA), Poly(3-hexylthiophene) (P3HT), NiO, or MoO$_3$.

In one embodiment regarding the solar cell, wherein the counter electrode layer comprises Pt, Au, Ni, Cu, Ag, In, Ru, Pd, Rh, Ir, Os, conductive carbon, indium doped tin oxide, conductive polymer, a combination thereof.

Materials Synthesis

All reactions sensitive to air and water were performed in an inert (argon) atmosphere using a Schlenk line setup and tubes. All chemical reagents and solvents were purchased from Sigma-Aldrich and used as received.

Scheme 1: Synthesis of the organotin reagents:

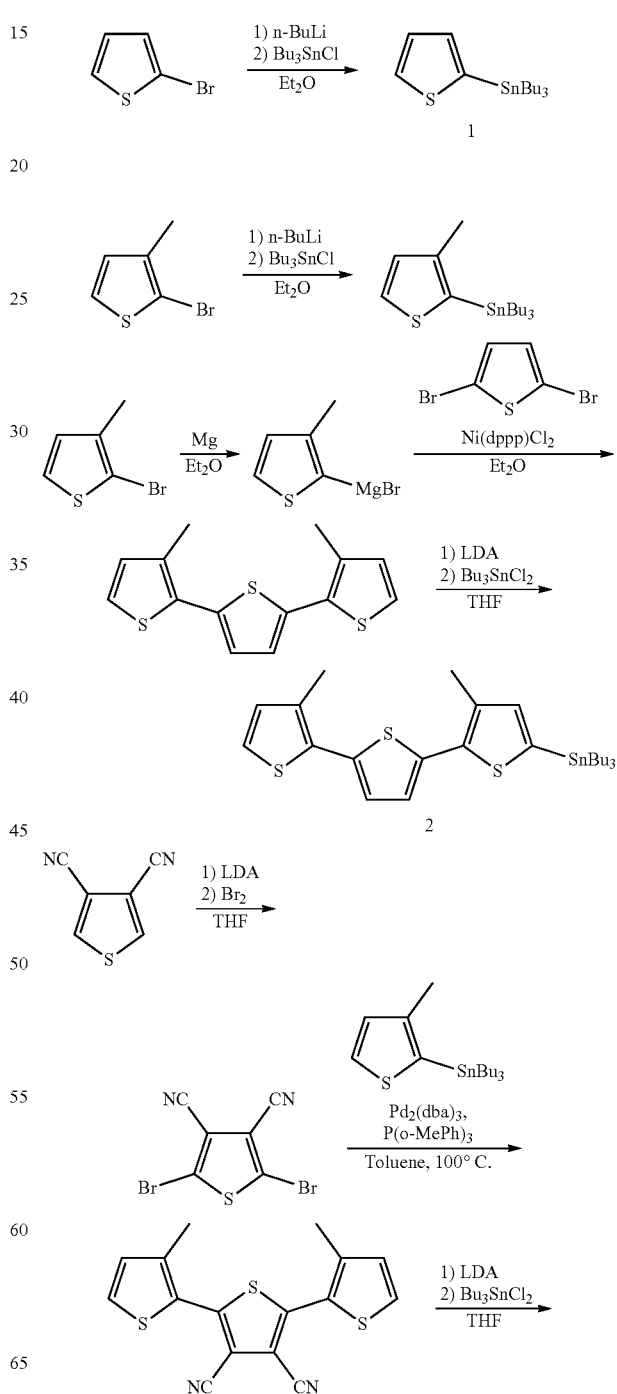

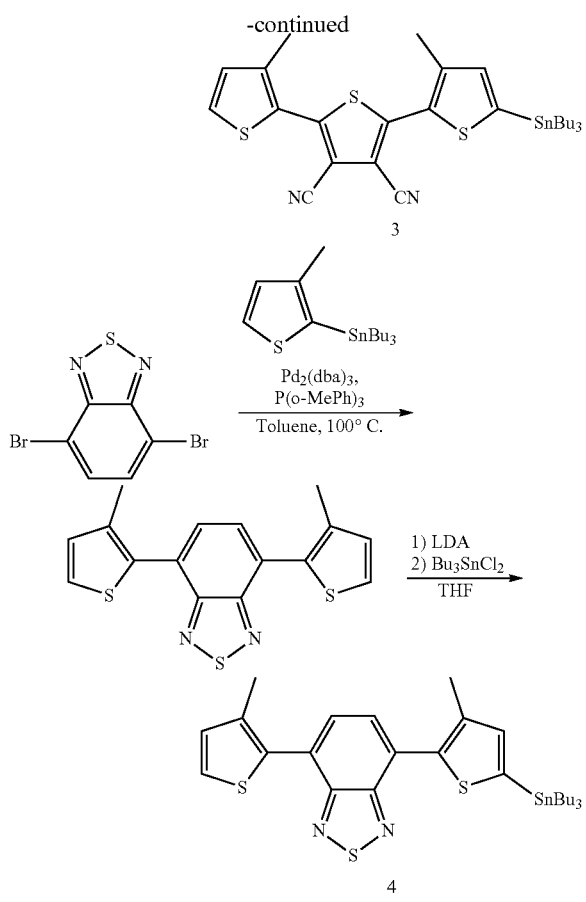

Tributyl(thiophen-2-yl)stannane (1): To a solution of 2-bromothiophene (4.89 g, 30.0 mmol) in Et$_2$O (60 mL) at −78° C. was syringed dropwise n-BuLi (12.2 mL of 2.5 M in hexane, 30.6 mmol) and the reaction was then stirred at −78° C. for half an hour. Tributylstannyl chloride (10.7 g, 33.0 mmol) was added at the same temperature, then the mixture was allowed to warm to room temperature. After washing with water, the organic phase was collected, and the aqueous phase was washed with Et$_2$O. The combined organic phases were washed with brine, dried, and the solvent was removed in vacuo to provide (1) as a clear pale-yellow oil which was used without further purification (11.5 g). $^1$H NMR (400 MHz, Chloroform-d): δ7.56 (d, J=4.7 Hz, 1H), 7.18 (dd, J=4.6, 3.2 Hz, 1H), 7.12 (d, J=3.1 Hz, 1H), 1.53-1.43 (m, 6H), 1.31-1.21 (m, 6H), 1.05-1.01 (m, 6H) and 0.82 (t, J=7.3 Hz, 9H).

Tributyl(3-methylthiophen-2-yl)stannane: To a solution of 2-bromo-3-methylthiophene (8.85 g, 50.0 mmol) in Et$_2$O (100 mL) at −78° C. was syringed dropwise n-BuLi (21.6 mL of 2.5 M in hexane, 54.0 mmol) and the reaction was then stirred at −78° C. for half an hour. Tributylstannyl chloride (17.9 g, 55.0 mmol) was added at the same temperature, then the mixture was allowed to warm to room temperature. After washing with water, the organic phase was collected, and the aqueous phase was washed with Et$_2$O. The combined organic phases were washed with brine, dried, and the solvent was removed in vacuo to provide the title compound as a clear pale-yellow oil which was used without further purification (19.6 g). $^1$H NMR (400 MHz, Chloroform-d) δ7.51 (d, J=4.6 Hz, 1H), 7.05 (d, J=4.5 Hz, 1H), 2.32 (s, 3H), 1.58-1.44 (m, 6H), 1.38-1.26 (m, 6H), 1.15-1.06 (m, 6H), 0.89 (t, J=7.3 Hz, 9H).

3,3"-Dimethyl-2,2':5',2"-terthiophene: A Grignard reagent, prepared by adding Et$_2$O solution of 2-bromo-3-methylthiophene (2.27 g, 12.8 mmol) into a mixture of Mg shavings (404 mg, 16.6 mmol) and small grain of iodine in 5 mL dry Et$_2$O, after refluxing for 3 h, and then cooled to room temperature, was slowly added to a solution containing 2,5-dibromothiophene (1.50 g, 6.20 mmol) and Ni(dppp)Cl$_2$ (3 mol %) in 20 mL dry Et$_2$O. The reaction mixture was heated to reflux overnight. Upon completion, the reaction was quenched by the addition of 30 mL 1 M HCl, extracted with DCM and washed with H$_2$O. The organic phase was then dried over MgSO$_4$ and concentrated under reduced pressure. The crude product was purified via column chromatography (silica gel, hexane), yielding the title compound as a slightly yellow oil, which slowly crystallized (1.60 g, 94%). $^1$H NMR (400 MHz, Chloroform-d) δ7.15 (d, J=5.1 Hz, 2H), 7.08 (s, 2H), 6.89 (d, J=5.1 Hz, 2H), 2.42 (s, 6H).

Tributyl(3,3"-dimethyl-[2,2':5',2"-terthiophen]-5-yl)stannane (2): To a solution of 3,3"-dimethyl-2,2':5',2"-terthiophene (575 mg, 2.08 mmol) in 20 ml of dry THF, a 2.0 M solution of lithium diisopropylamide (LDA) in hexane (1.20 ml, 2.40 mmol) was added dropwise at 0° C. The mixture was stirred for 1 h at room temperature. Afterwards the solution was cooled to 0° C. again and tri(n-butyl)stannyl chloride (745 g, 2.29 mmol) was added. Finally, the mixture was stirred at room temperature for 1 h. Afterwards the reaction mixture was poured into water and extracted with dichloromethane. The organic phase was washed with brine and the organic phase dried over MgSO$_4$. The solvent was removed under vacuum to produce a yellowish oil which was used without further purification (1.25 g). $^1$H NMR (400 MHz, Chloroform-d) δ7.14 (t, J=5.2 Hz, 1H), 7.09-7.06 (m, 2H), 6.92 (d, J=2.5 Hz, 1H), 6.89 (dd, J=5.1, 2.9 Hz, 1H), 2.43 (s, 3H), 2.42 (s, 3H), 1.62-1.54 (m, 6H), 1.40-1.31 (m, 6H), 1.17-1.05 (m, 6H), 0.91 (t, J=7.3 Hz, 9H).

2,5-Dibromothiophene-3,4-dicarbonitrile: A solution of 3,4-dicyanothiophene (2.41 g, 18.0 mmol) in dry THF (120 mL) under argon, was cooled to −78° C. and 18.9 mL (37.8 mmol) of LDA (2.0 M in solution of THF/n-heptane/ethylbenzene) was added dropwise. After stirring this mixture for 15 min at −78° C., bromine (2.03 mL, 39.6 mmol) was slowly added. The mixture was then stirred for 2 h at −78° C. The reaction was allowed to warm back to room temperature, then quenched by adding 50 mL of a saturated aqueous solution of NH$_4$Cl. The mixture was extracted with CH$_2$Cl$_2$ and the organic layer was dried over magnesium sulfate, filtered and then evaporated to dryness. The crude solid produced was purified by chromatography on silica gel with DCM as eluent to give 2,5-dibromo-3,4-dicyanothiophene as a white solid (3.16 g, 60%).

3,3"-Dimethyl-[2,2':5',2"-terthiophene]-3',4'-dicarbonitrile: A mixture of 2,5-dibromothiophene-3,4-dicarbonitrile (1.04 g, 3.55 mmol), Pd(PPh$_3$)$_4$ (82.0 mg, 0.071 mmol), and tributyl(3-methylthiophen-2-yl)stannane (3.02 g, 7.81 mmol) was heated to 80° C. in dry DMF (35 mL) under argon for 24 h. After cooling, a saturated solution of NH$_4$Cl (40 mL) was added and the mixture was extracted with DCM. The collected organic layer was then washed with brine. After drying over MgSO$_4$, the organic layer filtrate was concentrated under vacuum. Purification by column chromatography on silica gel eluting by DCM afforded a yellow solid (0.96 g, 83%). $^1$H NMR (400 MHz, Chloroform-d) δ7.46 (d, J=5.1 Hz, 2H), 7.02 (d, J=5.1 Hz, 2H), 2.43 (s, 6H).

3,3"-Dimethyl-5-(tributylstannyl)-[2,2':5',2"-terthiophene]-3',4'-dicarbonitrile (3): To a solution of 3,3"-dimethyl-[2,2':5',2"-terthiophene]-3',4'-dicarbonitrile (538 mg, 1.65 mmol) in 20 ml of dry THF, a 2.0 M solution of lithium diisopropylamide (LDA) in hexane (0.90 ml, 1.82 mmol) was added dropwise at −78° C. The mixture was stirred for 0.5 h at this temperature. Afterwards tri(n-butyl)stannyl chloride (0.54 mL, 1.98 mmol) was added at the same temperature. Finally, the mixture was stirred at room temperature for 1 h. Afterwards the reaction mixture was poured into water and extracted with dichloromethane. The organic phase was washed with brine and the organic phase dried over MgSO$_4$. The solvent was removed to produce a yellowish oil which was used without further purification (1.05 g). $^1$H NMR (400 MHz, Chloroform-d) δ7.48-7.42 (m, 1H), 7.04-6.99 (m, 2H), 2.46-2.41 (m, 6H), 1.63-1.53 (m, 6H), 1.40-1.31 (m, 6H), 1.19-1.09 (m, 6H), 0.91 (t, J=7.3 Hz, 9H). 4,7-Bis(3-methylthiophen-2-yl)benzo[c][1,2,5]thiadiazole: Tributyl(3-methylthiophen-2-yl)stannane (1.70 g, 4.40 mmol), 4,7-dibromobenzo[c][1,2,5]thiadiazole (588 mg, 2.00 mmol), Pd$_2$(dba)$_3$ (37 mg, 2 mol %) and P(o-tol)$_3$ (49 mg, 8 mol %) were mixed in a Schlenk tube. After replacing the air with argon, toluene (20 mL) was added via syringe. The mixture was stirred overnight at 100° C. After cooling to room temperature, water was added, and the mixture was extracted with dichloromethane (DCM). The organic layers were combined, washed with brine and dried over magnesium sulfate. The solids were removed by filtration, the solvents were removed under vacuum and the residue was chromatographed on a silica gel column (DCM/hexane=2:3), yielding a yellow solid (645 mg, 98%). $^1$H NMR (400 MHz, Chloroform-d) δ7.68 (s, 2H), 7.42 (d, J=5.1 Hz, 2H), 7.05 (d, J=5.1 Hz, 2H), 2.36 (s, 6H).

4-(3-Methyl-5-(tributylstannyl)thiophen-2-yl)-7-(3-methylthiophen-2-yl)benzo[c][1,2,5]thiadiazole (4): To a solution of 4,7-bis(3-methylthiophen-2-yl)benzo[c][1,2,5]thiadiazole (1.31 g, 4.00 mmol) in 60 ml of dry THF, a 2.0 M solution of lithium diisopropylamide (LDA) in hexane (2.00 ml, 4.00 mmol) was added dropwise at −78° C. The mixture was stirred for 0.5 h at this temperature. Afterwards tri(n-butyl)stannyl chloride (1.09 mL, 4.00 mmol) was added at the same temperature. Finally, the mixture was allowed to warm back to room temperature and stirred for 1 h. Afterwards the reaction mixture was poured into water and extracted with dichloromethane. The organic phase was washed with brine and the organic phase dried over MgSO$_4$. The solvent was removed and produced a yellowish oil which was used without further purification (2.51 g). $^1$H NMR (400 MHz, Chloroform-d) δ7.69-7.63 (m, 2H), 7.44-7.39 (m, 1H), 7.12-7.06 (m, 1H), 7.07-7.01 (m, 1H), 2.40-2.32 (m, 6H), 1.66-1.57 (m, 6H), 1.42-1.33 (m, 6H), 1.18-1.11 (m, 6H), 0.92 (t, J=7.3 Hz, 9H).

Scheme 2: Synthesis of the conjugated ligands (Reaction conditions: (i) Boc$_2$O, Et$_3$N, DCM, R.T., (ii) NBS, Chloroform, R.T., (iii) Pd$_2$(dba)$_3$, P(o-MePh)$_3$, Toluene, 100° C., (iv) HI, Methanol, R.T.):

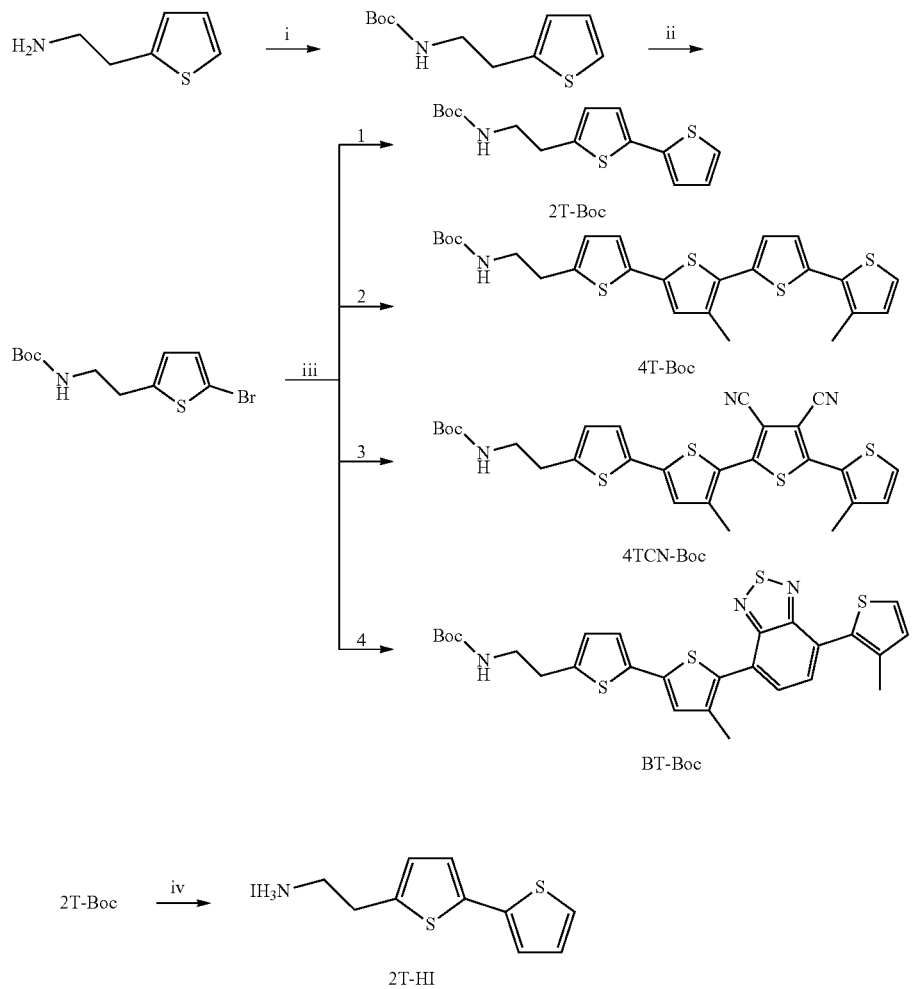

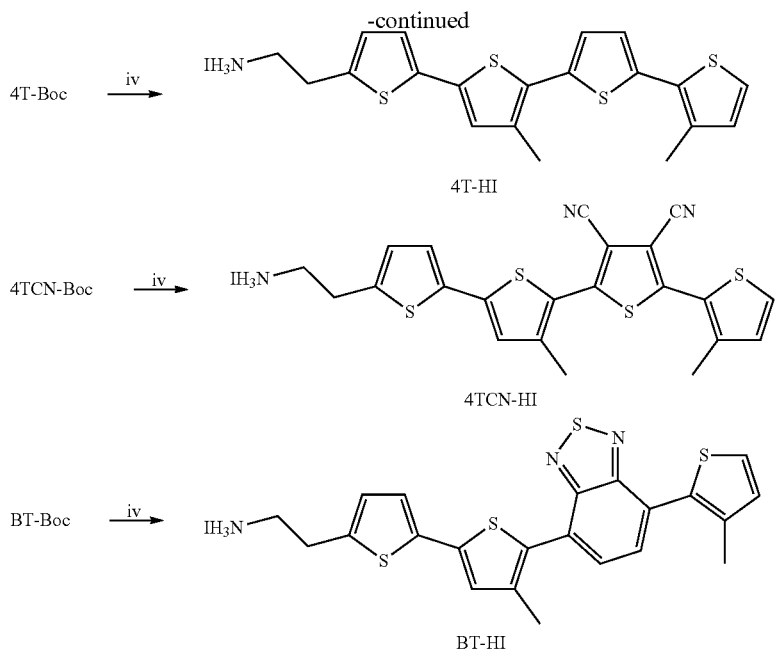

tert-Butyl(2-(thiophen-2-yl)ethyl)carbamate: 2-(Thiophen-2-yl)ethan-1-amine (7.63 g, 60.0 mmol) and 150 mL dry dichloromethane were added to a dried 250-mL Schlenk flask. Then, triethylamine (9.41 g, 93.0 mmol) was added to the solution. Di-tert-butyl dicarbonate (15.71 g, 72.00 mmol) was then added portion-wise which caused bubbles to evolve from the solution. After 4 h, the reaction mixture was placed in a separation funnel and washed with water. The organic layer was collected, dried over magnesium sulfate, and after filtration, the solvent was removed under reduced pressure to provide a yellow oil (98%), which was directly used for the next bromination step without further purification. $^1$H NMR (400 MHz, Chloroform-d) δ7.17-7.14 (m, 1H), 6.94 (dd, J=5.2, 3.4 Hz, 1H), 6.84-6.82 (m, 1H), 4.65 (s, 1H), 3.40 (d, J=6.5 Hz, 2H), 3.01 (t, J=6.7 Hz, 2H), 1.44 (s, 9H).

tert-Butyl(2-(5-bromothiophen-2-yl)ethyl)carbamate: tert-Butyl(2-(thiophen-2-yl)ethyl)carbamate (3.75 g, 16.5 mmol) was added to a 250-mL flask and dissolved in 50 mL chloroform. The reaction vessel was then wrapped in aluminum foil to exclude light, and NBS (3.08 g, 17.3 mmol) was then added portion wise. After 18 h, the reaction mixture was diluted with chloroform. This mixture was washed with water and then with brine. The organic layer was collected, dried over magnesium sulfate, and concentrated under reduced pressure to provide the crude product as a light-yellow oil. The product was purified by column chromatography with dichloromethane as eluent (90%). $^1$H NMR (400 MHz, Chloroform-d) δ6.87 (d, J=3.6 Hz, 1H), 6.59 (d, J=3.8 Hz, 1H), 4.64 (s, 1H), 3.35 (d, J=6.5 Hz, 2H), 2.93 (t, J=6.7 Hz, 2H), 1.44 (d, J=2.5 Hz, 9H).

General method for the synthesis of Boc protected ligands:

tert-Butyl(2-(5-bromothiophen-2-yl)ethyl)carbamate (612 mg, 2 mmol), Pd$_2$(dba)$_3$ (37 mg, 2 mol %), P(o-tol)$_3$ (49 mg, 8 mol %) and the corresponding organotin reagent (2.2 mmol) were mixed in a Schlenk tube. After replacing the air with argon, toluene (20 mL) was added via syringe. The mixture was stirred for 0.5 hours at 100° C. After cooling to room temperature, water was added, and the mixture was extracted with dichloromethane (DCM). The organic layers were combined, washed with brine and dried over magnesium sulfate. The solids were removed by filtration, solvents were removed under vacuum and the residue was chromatographed on a silica gel column as described below. The products were then converted to ammonium salts by adding HI aqueous solution to their methanol solutions.

tert-Butyl(2-([2,2'-bithiophen]-5-yl)ethyl)carbamate (2T-Boc): The crude product was purified by column chromatography with dichloromethane: hexane (1:1) as the eluent. Colorless liquid (72%). $^1$H NMR (400 MHz, Chloroform-d) δ7.19-7.17 (m, 1H), 7.10 (dd, J=3.7, 1.4 Hz, 1H), 7.00 (d, J=3.5 Hz, 1H), 6.99 (d, J=3.5 Hz, 1H), 6.73 (d, J=3.7 Hz, 1H), 4.68 (s, 1H), 3.41 (d, J=6.5 Hz, 2H), 2.98 (t, J=6.7 Hz, 2H), 1.45 (s, 9H). tert-Butyl(2-(3''',4'-dimethyl-[2,2':5',2'': 5'',2'''-quaterthiophen]-5-yl)ethyl)carbamate (4T-Boc): The product was purified with the same method of 2T-Boc. Yellow solid (68%). $^1$H NMR (400 MHz, Chloroform-d) δ7.15 (d, J=5.1 Hz, 1H), 7.08 (s, 2H), 6.99 (d, J=3.6 Hz, 1H), 6.91 (s, 1H), 6.89 (d, J=5.1 Hz, 1H), 6.73 (d, J=3.6 Hz, 1H), 4.67 (s, 2H), 3.40 (s, 2H), 3.08-2.91 (m, 2H), 2.41 (d, J=10.5 Hz, 6H), 1.45 (s, 9H).

tert-Butyl(2-(3'',4''-dicyano-3''',4'-dimethyl-[2,2':5',2'':5'', 2'''-quaterthiophen]-5-yl)ethyl)carbamate (4TCN-Boc): The product was purified by column chromatography with dichloromethane: ethyl acetate (10:1) as the eluent. Orange solid (70%). $^1$H NMR (400 MHz, Chloroform-d) δ7.46 (d, J=5.1 Hz, 1H), 7.08 (d, J=3.6 Hz, 1H), 7.02 (d, J=5.1 Hz, 1H), 7.00 (s, 1H), 6.77 (d, J=3.7 Hz, 1H), 4.68 (s, 1H), 3.42 (d, J=7.5 Hz, 2H), 3.01 (t, J=6.8 Hz, 2H), 2.43 (d, J=6.5 Hz, 6H), 1.45 (s, 9H).

tert-Butyl(2-(4'-methyl-5'-(7-(3-methylthiophen-2-yl) benzo[c][1,2,5]thiadiazol-4-yl)-[2,2'-bithiophen]-5-yl) ethyl)carbamate (BT-Boc): The product was purified by column chromatography with dichloromethane: hexane (2:1) as the eluent. Red solid (82%). $^1$H NMR (400 MHz, Chloroform-d) δ7.69 (d, J=2.1 Hz, 2H), 7.42 (d, J=5.1 Hz, 1H), 7.09-7.04 (m, 3H), 6.76 (d, J=3.5 Hz, 1H), 4.70 (s, 1H), 3.43 (d, J=6.9 Hz, 2H), 3.01 (t, J=6.6 Hz, 2H), 2.36 (d, J=0.9 Hz, 6H), 1.46 (s, 9H).

General method for the synthesis of ammonium salt ligands:

The respective Boc protected ligand (1 mmol) was dissolved in 20 mL methanol (some DCM was added to aid solubility where needed), and aqueous HI solution was then added at 0° C. to cleave the BOC protecting group and in-situ from the ammonium iodides of the ligands. After stirring for 6 h at room temperature, the solvents were removed under vacuum. Diethyl ether was added to the residue, the solid products were collected by filtration, and washed several times with diethyl ether. The products were dried under vacuum for further use.

2T-HI: white powder (90%). $^1$H NMR (400 MHz, DMSO-$d_6$) δ7.81 (s, 3H), 7.47 (dd, J=5.3, 1.4 Hz, 1H), 7.23 (dd, J=3.5, 1.3 Hz, 1H), 7.15 (d, J=3.5 Hz, 1H), 7.06 (dd, J=5.1, 3.5 Hz, 1H), 6.92 (d, J=3.6 Hz, 1H), 3.05 (d, J=4.0 Hz, 4H).

4T-HI: yellow powder (75%). $^1$H NMR (400 MHz, DMSO-$d_6$) δ7.80 (s, 3H), 7.47 (d, J=5.1 Hz, 1H), 7.26-7.19 (m, 3H), 7.17 (s, 1H), 7.01 (d, J=5.1 Hz, 1H), 6.96 (d, J=3.5 Hz, 1H), 3.09 (q, J=4.6 Hz, 4H), 2.38 (d, J=2.0 Hz, 6H).

4TCN-HI: orange powder (85%). $^1$H NMR (400 MHz, DMSO-$d_6$) δ7.84 (d, J=5.1 Hz, 1H), 7.79 (s, 3H), 7.34 (s, 1H), 7.33 (d, J=3.8 Hz, 1H), 7.16 (d, J=5.0 Hz, 1H), 7.02-6.97 (m, 1H), 3.08 (d, J=3.2 Hz, 4H), 2.39 (d, J=1.9 Hz, 6H).

BT-HI: red powder (83%). $^1$H NMR (500 MHz, DMSO-$d_6$) δ7.88-7.71 (m, 5H), 7.65 (t, J=4.6 Hz, 1H), 7.27-7.19 (m, 2H), 7.08 (d, J=4.3 Hz, 1H), 6.95 (t, J=3.5 Hz, 1H), 3.07 (d, J=5.7 Hz, 4H), 2.30 (dd, J=17.2, 3.6 Hz, 6H).

Those skilled in the art will recognize that numerous modifications can be made to the specific implementations described above. The implementations should not be limited to the particular limitations described. Other implementations may be possible.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected. It should be understood by those skilled in the art that various alternatives to the embodiments described herein may be employed in practicing the claims without departing from the spirit and scope as defined in the following claims.

19. The capping layer of claim 13, wherein ($R^1NH_3^+$) is selected from the group consisting of:
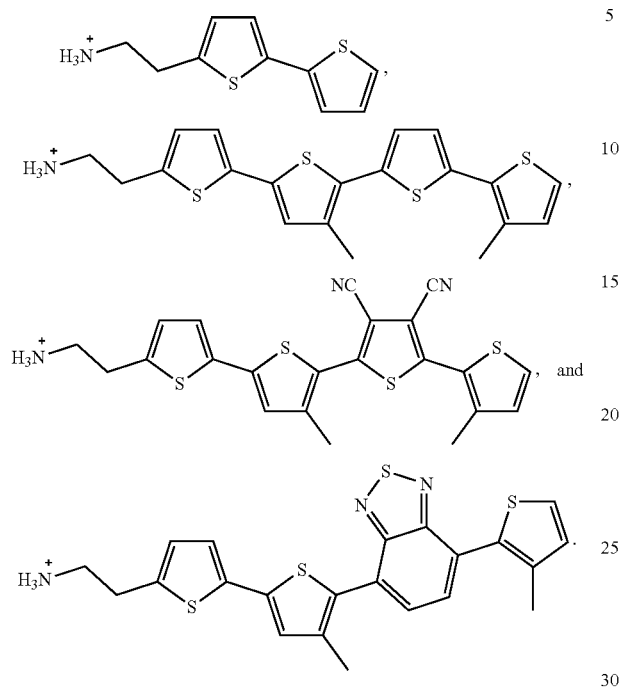

We claim:

1. A solar cell comprising, from bottom to top, a support layer; an electron transporting layer; a 3D perovskite layer; a multifunctional 2D perovskite capping layer; a hole transporting layer; and a counter electrode layer, wherein the 2D perovskite capping layer comprises an organic-inorganic hybrid perovskite of Formula I:

$$(R^1NH_3^+)_2(A^+)_{n-1}(M^{2+})_n(X^-)_{3n+1} \quad \quad I$$

wherein:

$(R^1NH_3^+)$ represents an asymmetric mono-ammonium cationic moiety:

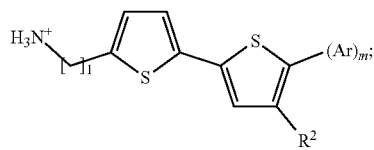

$A^+$ represents a cation $Cs^+$, $Rb^+$, $CH_3NH_3^+$, $CH_3CH_2NH_3^+$, or

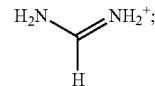

$R^2$ is —H, —F, —Cl, —Br, —I, —Me, —Et, —OMe, —OEt, —SMe, —SEt, —CN, —NO$_2$, —COMe, —CHO, —COOMe, or —NH—COMe;

$(Ar)_m$ represents a conjugated and optionally substituted aryl or hetero aryl system, or a combination thereof, wherein each aryl or hetero aryl ring in the conjugated and optionally substituted aryl or hetero aryl system may be same or different;

$M^{2+}$ represents a divalent metal cation $Pb^{2+}$, $Sn^{2+}$, $Ge^{2+}$, $Cu^{2+}$, $Zn^{2+}$, $Cd^{2+}$, $Hg^{2+}$, $Ni^{2+}$, $Co^{2+}$, $Fe^{2+}$, $Mn^{2+}$, $Cr^{2+}$, $V^{2+}$, $Pd^{2+}$, $Pt^{2+}$, or a combination thereof; or a combination of one monovalent metal cation selected from the group consisting of $Ag^+$, $Cu^+$, $Tl^+$, $Au^+$, and one trivalent metal cation selected from the group consisting of $Bi^{3+}$, $Sb^{3+}$, $In^{3+}$, $As^{3+}$, $Au^{3+}$, $Y^{3+}$, to make the average valence of the metal cation to be 2+;

X is F, Cl, Br or I;

l is 1-4;

m is 0-5; and n is 1-6;

wherein the positions of $R^2$ and $(Ar)_m$ on the thiophenyl ring can be exchanged;

where the 2D perovskite capping layer is the interfacial layer which supports interface charge transfer;

where the 3D perovskite layer is light absorbing material and the major light absorbing layer; and where the 3D perovskite layer and multifunctional 2D perovskite capping layer form a 2D/3D perovskite heterostructure which supports interface charge transfer.

2. The solar cell of claim 1, wherein $A^+$ is $CH_3NH_3^+$, $CH_3CH_2NH_3^+$, or

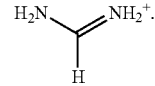

3. The solar cell of claim 1, wherein $R^2$ is —F, —Cl, —Br, —I, —Me, —Et, —OMe, —OEt, —SMe, —SEt, —CN, —NO$_2$, —COMe, —CHO, —COOMe, or —NH—COMe.

4. The solar cell of claim 1, wherein $(Ar)_m$ represents a conjugated and optionally substituted aryl or hetero aryl system, or a combination thereof, wherein each aryl or hetero aryl ring in the conjugated and optionally substituted aryl or hetero aryl system may be same or different, wherein Ar is selected from the group consisting of:

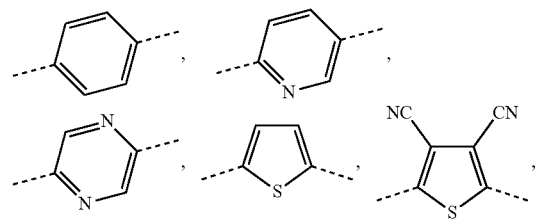

-continued

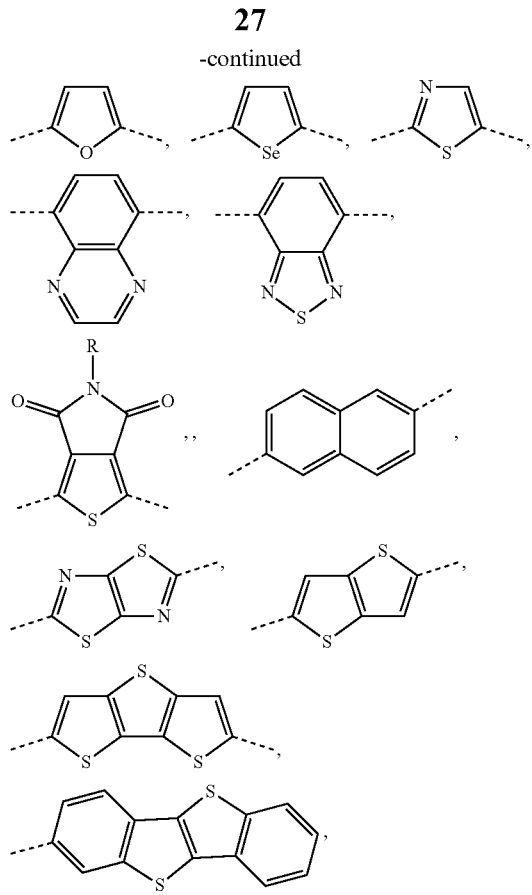

or a combination thereof.

5. The solar cell of claim 1, wherein Ar is selected from the group consisting of:

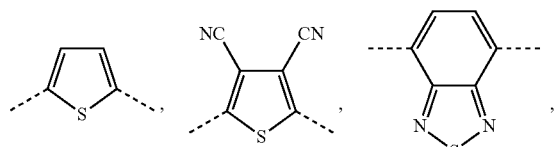

or a combination thereof.

6. The solar cell of claim 1, wherein $M^{2+}$ is a divalent metal cation comprising $Pb^{2+}$, $Sn^{2+}$, $Ge^{2+}$, $Cu^{2+}$, $Zn^{2+}$, $Cd^{2+}$, $Hg^{2+}$, $Ni^{2+}$, $Co^{2+}$, $Fe^{2+}$, $Mn^{2+}$, $Cr^{2+}$, $V^{2+}$, $Pd^{2+}$, $Pt^{2+}$, or a combination thereof.

7. The solar cell of claim 1, wherein $(R^1NH_3^+)$ is selected from the group consisting of:

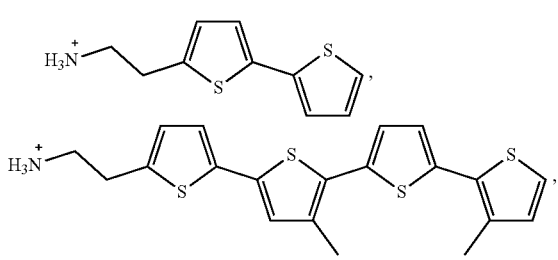

-continued

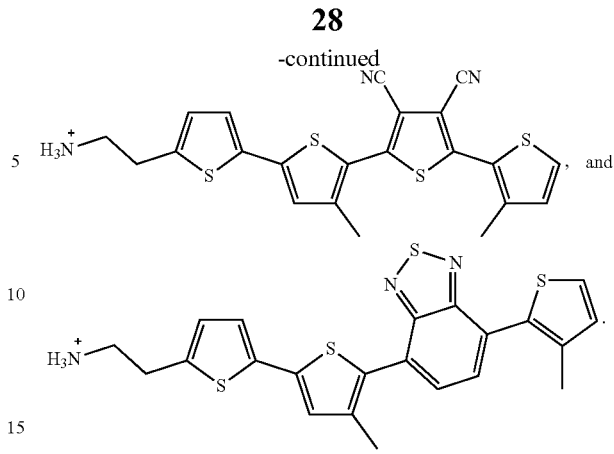

8. The solar cell of claim 1, wherein the support layer comprises indium doped tin oxide (ITO), fluorine doped tin oxide (FTO), ZnO—$Ga_2O_3$, ZnO—$Al_2O_3$, tin oxide, antimony doped tin oxide (ATO), $SrGeO_3$, zinc oxide, or a combination thereof.

9. The solar cell of claim 1, wherein electron transporting layer comprises [6,6]-phenyl-$C_{61}$-butyric acid methyl ester (PCBM), 1,4,5,8,9,11-hexazatriphenylene-hexacarbonitrile (HAT-CN), ($C_{60}$—$I_h$)[5,6]fullerene (C60), (C70-D5h)[5,6] fullerene (C70), [6,6]-Phenyl $C_{71}$ butyric acid methyl ester (PC70BM), 2,9-dimethyl-4,7-diphenyl-1,10-phenanthroline (BCP), 1,3,5-tri(phenyl-2-benzimi-dazolyl)-benzene (TPBI), polyethyleneimine ethoxylated (PEIE), poly [(9,9-bis(3'-(N,N-dimethylamino)propyl)-2,7-fluorene)-alt-2,7-(9,9-dioctylfluorene)] (PFN), or metal oxide, wherein the metal oxide is an oxide of a metal selected from a group of metal consisting of Ti, Sn, Cs, Fe, Zn, W, Nb, SrTi, Si, Ti, Al, Cr, Sn, Mg, Mn, Zr, Ni, or Cu.

10. The solar cell of claim 1, wherein the hole transporting layer comprises triphenylamine, carbazole, N,N, (diphenyl)-N',N'di-(alkylphenyl)-4,4'-biphenyldiamine, (pTPDs), diphenylhydrazone, poly [N,N'-bis(4-butylphenyl)-N,N'-bis (phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9,9'-spirobifluorene) (spiro-OMeTAD), N,N,N',N'-tetraphenylbenzidine (TPD), poly [bis(4-phenyl)(2,4,6-trimethylphenyl)amine (PTAA), Poly(3-hexylthiophene) (P3HT), NiO, or $MoO_3$.

11. The solar cell of claim 1, wherein the counter electrode layer comprises Pt, Au, Ni, Cu, Ag, In, Ru, Pd, Rh, Ir, Os, conductive carbon, indium-doped tin oxide, fluorine-doped tin oxide, conductive polymer, or a combination thereof.

12. The solar cell of claim 1, wherein the multifunctional capping layer (MCL) is a mixture of a molecular layer of $R^1NH_3^+$ of Formula I, and a thin layer of two-dimensional (2D) perovskite $(R^1NH_3^+)_2(A^+)_{n-1}(M^{2+})_n(X^-)_{3n+1}$.

13. A capping layer for perovskite of a solar cell for enhancing efficiency and durability, comprising an organic-inorganic hybrid 2D perovskite capping layer which is formed on a 3D perovskite absorbing layer, wherein the organic-inorganic hybrid 2D perovskite capping layer has a formula of Formula I:

$$(R^1NH_3^+)_2(A^+)_{n-1}(M^{2+})_n(X^-)_{3n+1} \qquad \text{I}$$

wherein:

($R^1NH_3^+$) represents an asymmetric mono-ammonium cationic moiety:

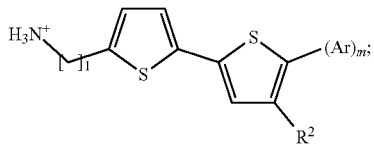

$A^+$ represents a cation $Cs^+$, $Rb^+$, $CH_3NH_3^+$, $CH_3CH_2NH_3^+$, or

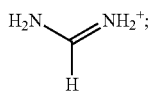

$R^2$ is —H, —F, —Cl, —Br, —I, —Me, —Et, —OMe, —OEt, —SMe, —SEt, —CN, —NO$_2$, —COMe, —CHO, —COOMe, or —NH—COMe;

$(Ar)_m$ represents a conjugated and optionally substituted aryl or hetero aryl system, or a combination thereof, wherein each aryl or hetero aryl ring in the conjugated and optionally substituted aryl or hetero aryl system may be same or different;

$M^{2+}$ represents a divalent metal cation $Pb^{2+}$, $Sn^{2+}$, $Ge^{2+}$, $Cu^{2+}$, $Zn^{2+}$, $Cd^{2+}$, $Hg^{2+}$, $Ni^{2+}$, $Co^{2+}$, $Fe^{2+}$, $Mn^{2+}$, $Cr^{2+}$, $V^{2+}$, $Pd^{2+}$, $Pt^{2+}$, or a combination thereof; or a combination of one monovalent metal cation selected from the group consisting of $Ag^+$, $Cu^+$, $Tl^+$, $Au^+$, and one trivalent metal cation selected from the group consisting of $Bi^{3+}$, $Sb^{3+}$, $In^{3+}$, $As^{3+}$, $Au^{3+}$, $Y^{3+}$, to make the average valence of the metal cation to be 2+;

X is F, Cl, Br or I;

l is 1-4;

m is 0-5; and n is 1-6;

wherein the positions of $R^2$ and $(Ar)_m$ on the thiophenyl ring can be exchanged; and the capping layer comprises formation of a heterostructure composed of 2D and 3D perovskites, where the organic-inorganic hybrid 2D perovskite capping layer is formed on the 3D perovskite absorbing layer, where the 3D perovskite layer and multifunctional 2D perovskite capping layer form a 2D/3D perovskite heterostructure which supports interface charge transfer.

14. The capping layer of claim 13, wherein $A^+$ is $CH_3NH_3^+$, $CH_3CH_2NH_3^+$, or

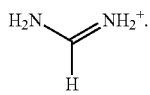

15. The capping layer of claim 13, wherein $R^2$ is —F, —Cl, —Br, —I, —Me, —Et, —OMe, —OEt, —SMe, —SEt, —CN, —NO$_2$, —COMe, —CHO, —COOMe, or —NH—COMe.

16. The capping layer of claim 13, wherein $(Ar)_m$ represents a conjugated and optionally substituted aryl or hetero aryl system, or a combination thereof, wherein each aryl or hetero aryl ring in the conjugated and optionally substituted aryl or hetero aryl system may be same or different, wherein Ar is selected from the group consisting of:

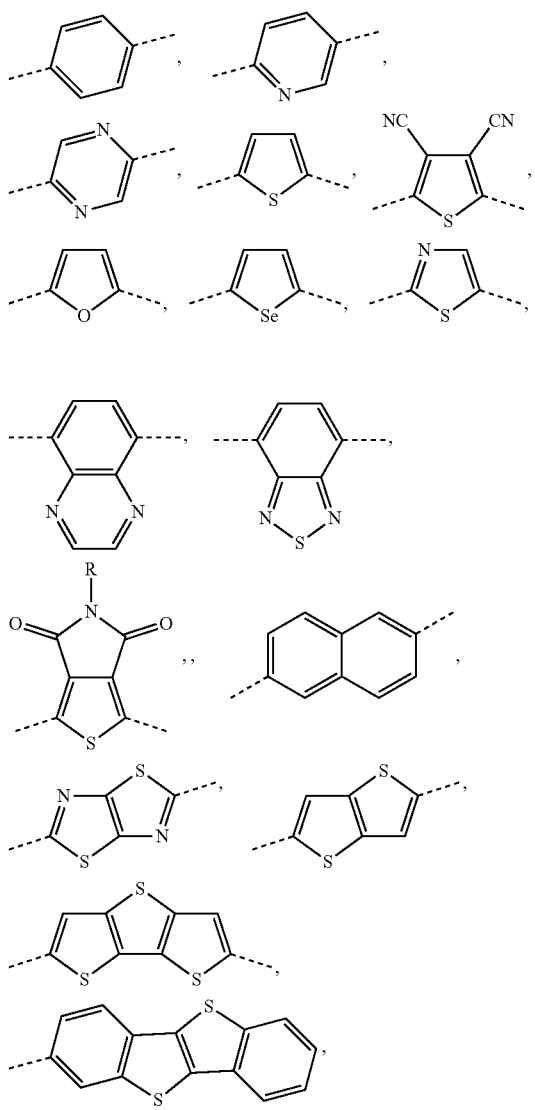

or a combination thereof.

17. The capping layer of claim 13, wherein Ar is selected from the group consisting of:

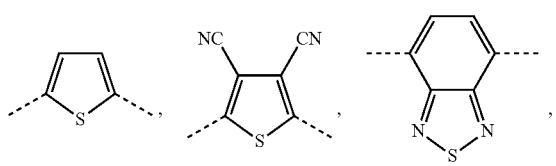

or a combination thereof.

18. The capping layer of claim 13, wherein $M^{2+}$ is a divalent metal cation comprising $Pb^{2+}$, $Sn^{2+}$, $Ge^{2+}$, $Cu^{2+}$, $Zn^{2+}$, $Cd^{2+}$, $Hg^{2+}$, $Ni^{2+}$, $Co^{2+}$, $Fe^{2+}$, $Mn^{2+}$, $Cr^{2+}$, $V^{2+}$, $Pd^{2+}$, $Pt^{2+}$, or a combination thereof.